(12) United States Patent
Nam et al.

(10) Patent No.: US 11,778,849 B2
(45) Date of Patent: Oct. 3, 2023

(54) DISPLAY MODULE, DISPLAY PANEL, AND METHOD FOR MANUFACTURING THE DISPLAY PANEL

(71) Applicant: Samsung Display Co., Ltd., Yongin-Si (KR)

(72) Inventors: Keehyun Nam, Seoul (KR); Jun-woo Kim, Hwaseong-si (KR); Hyesuk An, Daegu (KR); Gyung-hyun Ko, Hwaseong-si (KR); Hoon Kim, Gwangju (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 164 days.

(21) Appl. No.: 17/172,453

(22) Filed: Feb. 10, 2021

(65) Prior Publication Data

US 2021/0193955 A1   Jun. 24, 2021

Related U.S. Application Data

(62) Division of application No. 16/366,572, filed on Mar. 27, 2019, now Pat. No. 10,964,908.

(30) Foreign Application Priority Data

Jun. 22, 2018   (KR) .................. 10-2018-0072386

(51) Int. Cl.
*H10K 50/82* (2023.01)
*H10K 50/842* (2023.01)
(Continued)

(52) U.S. Cl.
CPC ....... *H10K 50/8426* (2023.02); *H10K 50/844* (2023.02); *H10K 59/1213* (2023.02);
(Continued)

(58) Field of Classification Search
CPC combination set(s) only.
See application file for complete search history.

(56) References Cited

U.S. PATENT DOCUMENTS 7,902,752 B2   3/2011   Chu et al.
9,444,919 B2   9/2016   Bae et al.
(Continued)

FOREIGN PATENT DOCUMENTS

KR   101406129 B1   6/2014
KR   101532590 B1   6/2015
(Continued)

OTHER PUBLICATIONS

Partial European Search Report for Application No. 19173722.0-1221 dated Sep. 13, 2019.

*Primary Examiner* — Moin M Rahman
(74) *Attorney, Agent, or Firm* — CANTOR COLBURN LLP

(57) ABSTRACT

A display module includes a window including a base substrate and a bezel pattern overlapping the base substrate in a plan view, and a display panel. The bezel pattern includes a first bezel pattern extending along an edge of the base substrate, and a second bezel pattern which extends from the first bezel pattern and of which at least a portion defines a transmission area. The display panel includes a glass substrate, an encapsulation substrate on the glass substrate, a sealing member coupling the glass substrate and the encapsulation substrate and overlapping the first bezel pattern in the plan view, a circuit element layer disposed on the glass substrate and including a transistor, and a display element layer disposed on the circuit element layer and including light emitting elements. The display element layer exposes a portion of a layer disposed thereunder, which corresponds to the transmission area.

7 Claims, 30 Drawing Sheets

(51) Int. Cl.
  *H10K 50/844* (2023.01)
  *H10K 59/121* (2023.01)
  *H01L 27/12* (2006.01)
  *H10K 10/46* (2023.01)
  *H10K 59/124* (2023.01)
  *H10K 59/125* (2023.01)
  *H10K 59/127* (2023.01)
  *H10K 59/12* (2023.01)
  *H10K 71/00* (2023.01)

(52) U.S. Cl.
  CPC .......... *H01L 27/1211* (2013.01); *H10K 10/46* (2023.02); *H10K 59/1201* (2023.02); *H10K 59/124* (2023.02); *H10K 59/125* (2023.02); *H10K 59/127* (2023.02); *H10K 71/851* (2023.02)

(56) References Cited

U.S. PATENT DOCUMENTS

| | | |
|---|---|---|
| 2013/0258234 A1 | 10/2013 | Park et al. |
| 2017/0162111 A1 | 6/2017 | Kang et al. |
| 2017/0200914 A1 | 7/2017 | Min |
| 2017/0287992 A1 | 10/2017 | Kwak et al. |
| 2017/0294502 A1 | 10/2017 | Ka et al. |
| 2018/0146564 A1* | 5/2018 | Wang ........................ H05K 5/03 |
| 2018/0151845 A1 | 5/2018 | Jeong et al. |

FOREIGN PATENT DOCUMENTS

| | | |
|---|---|---|
| KR | 1020170065059 A | 6/2017 |
| KR | 1020170111827 A | 10/2017 |
| KR | 1020170117291 A | 10/2017 |

* cited by examiner

DISPLAY MODULE, DISPLAY PANEL, AND METHOD FOR MANUFACTURING THE DISPLAY PANEL

This application is a divisional of U.S. patent application Ser. No. 16/366,572, filed on Mar. 27, 2019, which claims priority to Korean Patent Application No. 10-2018-0072386, filed on Jun. 22, 2018, and all the benefits accruing therefrom under 35 U.S.C. § 119, the content of which in its entirety is herein incorporated by reference.

BACKGROUND

1. Field

Exemplary embodiments of the invention herein relate to a display module, a display panel included in the display module, and a method for manufacturing the display panel, and more particularly, to a display module including a transmission area through which an optical signal transmits, a display panel included therein, and a method for manufacturing the display panel.

2. Description of Related Art

Recently, portable electronic devices have been widely used, and various functions of the portable electronic devices have been developed. Users may desire an electronic device having a wider display area and a narrower bezel area. In this regard, various electronic devices are being developed to reduce a bezel area.

SUMMARY

Exemplary embodiments of the invention may provide a display module having a wide display area and a narrow bezel area.

Exemplary embodiments of the invention may also provide a display panel including a wide display area and a narrow non-display area.

Exemplary embodiments of the invention may further provide a method for manufacturing a display panel, which is capable of reducing a failure rate.

In an exemplary embodiment of the invention, a display module includes a window including a base substrate and a bezel pattern overlapping the base substrate in a plan view, and a display panel. The bezel pattern includes a first bezel pattern extending along an edge of the base substrate, and a second bezel pattern which extends from the first bezel pattern to have a shape being convex toward a center of the window in the plan view. At least a portion of the second bezel pattern defines a transmission area. The display panel includes a glass substrate, an encapsulation substrate disposed on the glass substrate, a sealing member coupling the glass substrate and the encapsulation substrate to each other and overlapping the first bezel pattern in the plan view, a circuit element layer disposed on the glass substrate and including a transistor, and a display element layer disposed on the circuit element layer and including light emitting elements. The display element layer exposes a portion of a layer disposed under the display element layer such that the portion of the layer corresponds to the transmission area.

In an exemplary embodiment, the circuit element layer may expose a portion of the glass substrate, which corresponds to the transmission area. The portion of the glass substrate may be exposed to a gas.

In an exemplary embodiment, the circuit element layer may include a circuit area not overlapping the bezel pattern, and a boundary area overlapping the second bezel pattern. The boundary area may have a thickness less than a thickness of the circuit area.

In an exemplary embodiment, the second bezel pattern may not overlap the sealing member in the plan view.

In an exemplary embodiment, the layer disposed under the display element layer may be an insulating layer of the circuit element layer or the glass substrate.

In an exemplary embodiment, the display element layer may include an element area not overlapping the bezel pattern, and a boundary area overlapping the second bezel pattern. The boundary area may have a thickness less than a thickness of the element area. The light emitting element is disposed in the element area.

In an exemplary embodiment, the light emitting elements may not overlap the second bezel pattern.

In an exemplary embodiment, areas of the circuit element layer and the display element layer, which overlap the second bezel pattern, may be defined as a boundary area, and a thickness of the boundary area may become less toward the portion of the glass substrate.

In an exemplary embodiment, the encapsulation substrate may include a glass substrate.

In an exemplary embodiment, the encapsulation substrate may overlap the second bezel pattern and the transmission area.

In an exemplary embodiment, the display module may further include an anti-reflector disposed between the window and the display panel. An opening corresponding to the transmission area may be defined in the anti-reflector.

In an exemplary embodiment, the display module may further include a resin filling the opening, and a refractive index of the resin may range from about 1.4 to about 1.6.

In an exemplary embodiment, the anti-reflector may include a polarizer and a retarder.

In an exemplary embodiment, the display module may further include an adhesive member coupling the window to the anti-reflector. An opening corresponding to the opening of the anti-reflector may be defined in the adhesive member.

In an exemplary embodiment, the display module may further include a resin filling the opening of the adhesive member and the opening of the anti-reflector, and a refractive index of the resin may range from about 1.4 to about 1.6.

In an exemplary embodiment, the display module may further include a resin filling the opening of the adhesive member and the opening of the anti-reflector. The resin may contact the base substrate of the window, and a refractive index of the resin may be substantially equal to a refractive index of the base substrate of the window.

In an exemplary embodiment, the display module may further include an input detection sensor disposed between the window and the display panel. The input detection sensor may include sensing electrodes disposed directly on the encapsulation substrate, and an insulating layer covering the sensing electrodes.

In an exemplary embodiment, the second bezel pattern may include a curved area in the plan view.

In an exemplary embodiment, a width of the second bezel pattern may be equal to or less than about 70 percent (%) of a width of the first bezel pattern.

In an exemplary embodiment, a portion of the first bezel pattern may define the transmission area together with the second bezel pattern, and the portion of the first bezel pattern may have a width less than a width of another portion of the first bezel pattern.

In an exemplary embodiment, inner lines of the first and second bezel patterns, which define the transmission area, may define a circle shape.

In an exemplary embodiment of the invention, a display panel may include a glass substrate, a circuit element layer disposed on a top surface of the glass substrate and including a transistor, a display element layer disposed on the circuit element layer and including light emitting elements, an encapsulation substrate disposed on the display element layer, and a sealing member coupling the glass substrate and the encapsulation substrate and disposed outside the circuit element layer in a plan view. An insulating layer of the circuit element layer which contacts the transistor may have an outer edge. The outer edge may include a concave region which is concave toward a center of the insulating layer in the plan view, and a portion of the top surface of the glass substrate which corresponds to the concave region may be exposed from the insulating layer.

In an exemplary embodiment of the invention, a method for manufacturing a display panel may include forming a circuit element layer including a transistor in each of a plurality of unit cell areas of a first work substrate, forming a display element layer including a light emitting element in each of the plurality of unit cell areas, coupling a second work substrate to the first work substrate to form a work panel, and cutting the work panel to separate portions corresponding to the plurality of unit cell areas from each other.

In an exemplary embodiment, the forming the circuit element layer may include depositing an insulating layer in each of the plurality of unit cell areas. The insulating layer may have an outer edge, and the outer edge may include a concave region which is concave toward a center of the insulating layer in a plan view. A portion of a top surface of the first work substrate which corresponds to the concave region may be exposed from the insulating layer.

In an exemplary embodiment, the depositing the insulating layer may be performed using a first mask assembly. The first mask assembly may include a frame in which an opening is defined, a plurality of first sticks coupled to the frame to overlap the opening, extending in a first direction, and arranged in a second direction intersecting the first direction, and a plurality of second sticks disposed to intersect the plurality of first sticks.

In an exemplary embodiment, each of the plurality of first sticks may include a stick portion having a straight line shape; and a mask portion coupled to the stick portion and protruding outside the stick portion in the plan view.

In an exemplary embodiment, an edge of the mask portion may include a curved line when viewed in the plan view.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
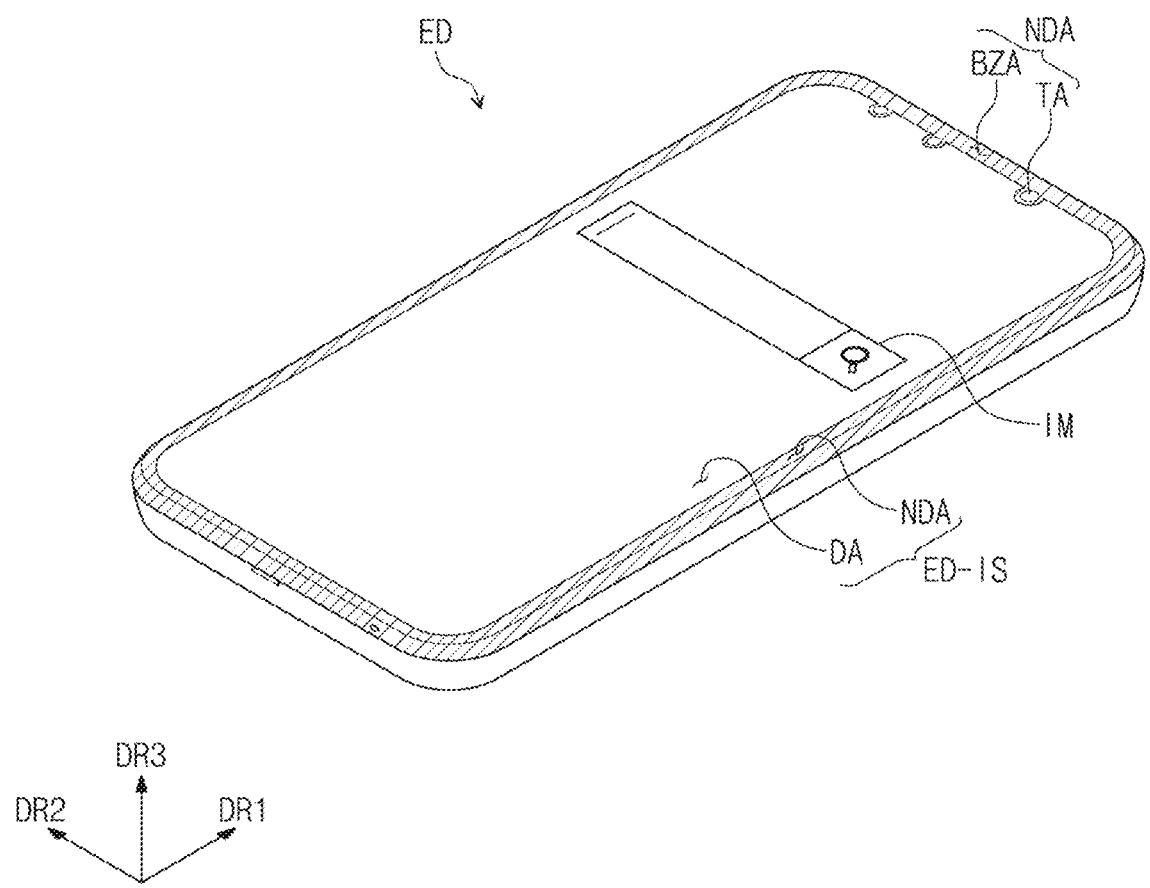
FIG. 1 is a perspective view illustrating an exemplary embodiment of an electronic device according to the invention.

The invention now will be described more fully hereinafter with reference to the accompanying drawings, in which various embodiments are shown. The invention may, however, be embodied in many different forms, and should not be construed as limited to the exemplary embodiments set forth herein. Rather, these embodiments are provided so that this invention will be thorough and complete, and will fully convey the scopes of the invention to those skilled in the art. Like reference numerals refer to like elements throughout. It will be understood that when an element such as a layer, region or substrate is referred to as being "on" another element, it may be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Drawing figures. It will be understood that relative terms are intended to encompass different orientations of the device in addition to the orientation depicted in the Drawing figures. In an exemplary embodiment, when the device in one of the drawing figures is turned over, elements described as being on the "lower" side of other elements would then be oriented on "upper" sides of the other elements. The exemplary term "lower," may therefore, encompasses both an orientation of "lower" and "upper," depending on the particular orientation of the figure. Similarly, when the device in one of the drawing figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. In an exemplary embodiment, when the device in the drawing figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the drawing figures are schematic in nature and their shapes are not intended to illustrate the precise shape of a region and are not intended to limit the scope of the claims.

Figure 2:
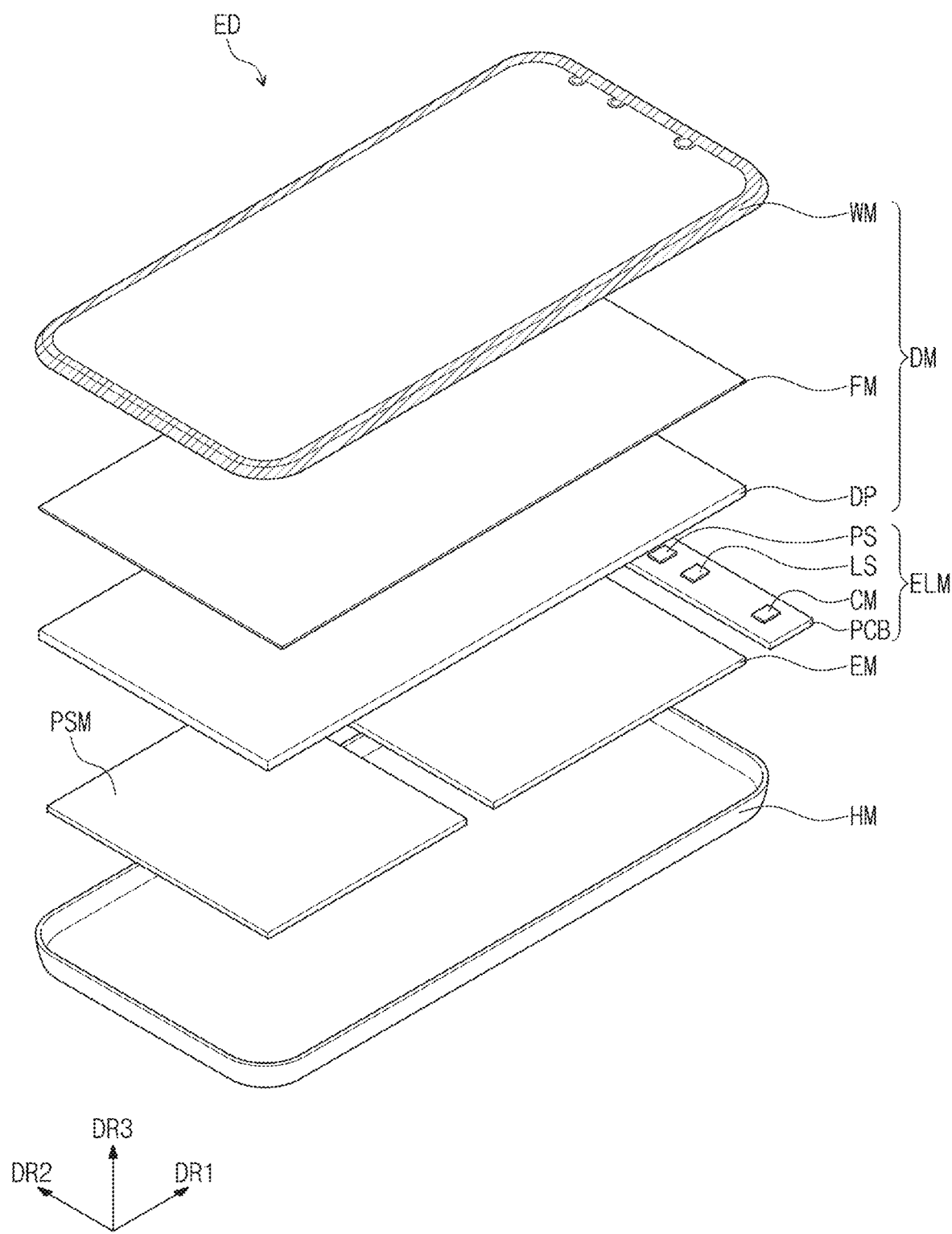
FIG. 2 is an exploded perspective view illustrating an exemplary embodiment of an electronic device according to the invention.
Figure 3:
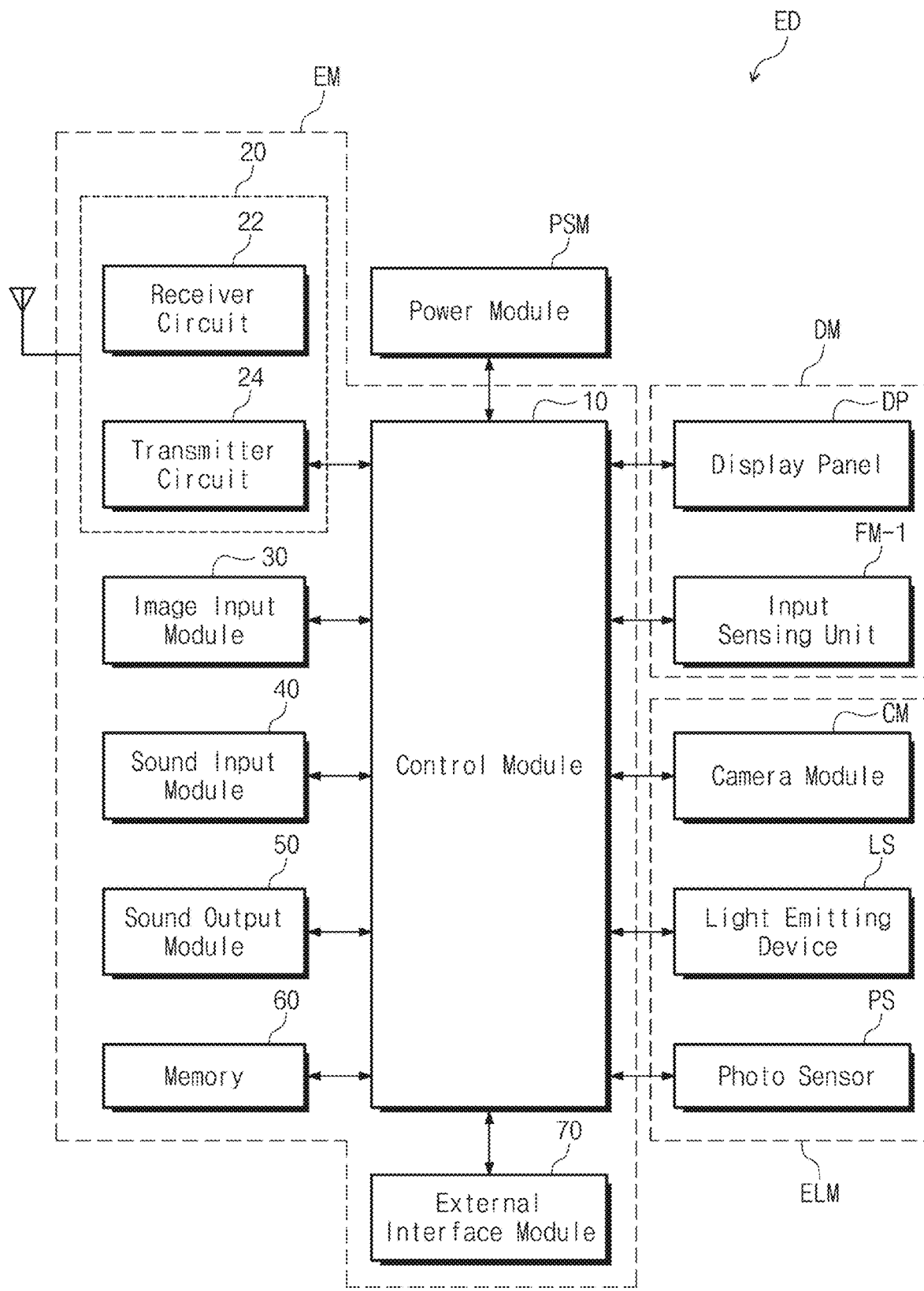
FIG. 3 is a block diagram illustrating an exemplary embodiment of an electronic device according to the invention.

FIG. 1 is a perspective view illustrating an exemplary embodiment of an electronic device ED according to the invention. FIG. 2 is an exploded perspective view illustrating an exemplary embodiment of the electronic device ED according to the invention. FIG. 3 is a block diagram illustrating an exemplary embodiment of the electronic device ED according to the invention.

As illustrated in FIG. 1, the electronic device ED may display an image IM through a display surface ED-IS. The display surface ED-IS may be parallel to a plane defined by a first directional axis (also referred to as a first direction) DR1 and a second directional axis (also referred to as a second direction) DR2. A normal direction of the display surface ED-IS (i.e., a thickness direction of the electronic device ED) may be indicated by a third directional axis (also referred to as a third direction) DR3.

A front surface (or a top surface) and a rear surface (or a bottom surface) of each of members or units described hereinafter may be defined by the third directional axis DR3. However, the first to third directional axes DR1, DR2 and DR3 of the illustrated exemplary embodiment are illustrated as an example. Hereinafter, first to third directions are defined as directions indicated by the first to third directional axes DR1, DR2 and DR3, respectively, and are indicated by the same reference designators as the first to third directional axes DR1, DR2 and DR3, respectively.

The display surface ED-IS may include a display area DA and a non-display area NDA adjacent to the display area DA. An image may not be displayed in the non-display area NDA. The non-display area NDA may include a bezel area BZA and a transmission area TA. The bezel area BZA may block an optical signal, and the transmission area TA may transmit the optical signal. Three transmission areas TA are illustrated as an example in FIGS. 1 and 2. However, the invention is not limited thereto, and in other exemplary embodiments, the non-display area NDA may include a different number of transmission areas TA. In an exemplary embodiment, the optical signal may be external natural light or light (e.g., infrared light) generated from a light emitting device LS (refer to FIG. 2).

In the exemplary embodiment, the non-display area NDA surrounding the display area DA is illustrated as an example. However, the invention is not limited thereto. In certain embodiments, the non-display area NDA may be adjacent to at least one side of the display area DA. In the exemplary embodiment, a flat display surface ED-IS is illustrated as an example. In an alternative exemplary embodiment, curved areas may be disposed along edges of the display surface ED-IS, which extend in the first direction DR1 and are opposite to each other in the second direction DR2.

A portable or smart phone is illustrated as an example of the electronic device ED in the exemplary embodiment. However, the invention is not limited thereto. In other exemplary embodiments, the electronic device ED may be at least one of various information providing devices such as a television, a navigation system, a computer monitor, and a game console.

As illustrated in FIGS. 2 and 3, the electronic device ED may include a display module DM, an electronic module EM, an electronic optical module ELM, a power module PSM, and a housing HM.

The display module DM may generate an image. The display module DM may include a display panel DP, a functional member FM, and a window WM.

The display panel DP is not limited to a specific display panel. In an exemplary embodiment, the display panel DP may be a light emitting type display panel such as an organic light emitting display panel or a quantum-dot light emitting display panel, for example.

The display module DM may sense an external input and/or external pressure, depending on a configuration of the functional member FM. The functional member FM may include various members for improving functions of the display module DM.

The functional member FM may include an anti-reflector and an input detection sensor. The anti-reflector may include a polarizer and/or a retarder. The polarizer and the retarder may be an elongated type or a coated type. The input detection sensor may include a capacitive touch panel, a pressure sensitive touch panel, or an electromagnetic induction touch panel.

The window WM may provide an outer surface of the electronic device ED. The window WM may include a base substrate and may further include functional layers such as an anti-reflection layer and an anti-fingerprint layer. Even though not shown in the drawings, the display module DM may include at least one adhesive member. The adhesive member may be an optically clear adhesive member or a pressure sensitive adhesive member.

The electronic module EM may include a control module 10, a wireless communication module 20, an image input module 30, a sound input module 40, a sound output module 50, a memory 60, and an external interface module 70. The modules may be disposed (e.g., mounted) on a circuit board or may be electrically connected to the circuit board through a flexible circuit board. The electronic module EM may be electrically connected to the power module PSM.

The control module 10 may control overall operations of the electronic device ED. In an exemplary embodiment, the control module 10 may activate or inactivate the display module DM in accordance with user's input, for example. The control module 10 may control the image input module 30, the sound input module 40, and the sound output module 50 in accordance with user's input. In an exemplary embodiment, the control module 10 may include at least one microprocessor, for example.

In an exemplary embodiment, the wireless communication module 20 may transmit/receive a wireless signal to/from other terminal(s) by Bluetooth or Wi-Fi, for example. The wireless communication module 20 may transmit/receive a voice signal by a general communication line. The wireless communication module 20 may include a transmitter circuit 24 which modulates a signal to be transmitted and transmits the modulated signal, and a receiver circuit 22 which demodulates a received signal.

The image input module 30 may process an image signal to convert the image signal into image data for displaying an image in the display module DM. The sound input module 40 may receive an external sound signal through a microphone in a recording mode or a voice recognition mode and may convert the received sound signal into electrical sound data. The sound output module 50 may convert sound data received from the wireless communication module 20 or sound data stored in the memory 60 and may output the converted sound data to the outside.

The external interface module 70 may be connected to and interface with an external charger, a cable/wireless data port, and/or a card socket (e.g., a memory card or a subscriber identification module ("SIM")/user identity module ("UIM") card).

The electronic optical module ELM may include a camera module CM. The camera module CM may capture or obtain an external image. The electronic optical module ELM may further include a light emitting device LS and a photo sensor PS. The light emitting device LS may emit infrared light, and the photo sensor PS may receive infrared light reflected by an external object. The light emitting device LS and the photo sensor PS may perform a function of a proximity sensor. The camera module CM, the light emitting device LS and the photo sensor PS may be disposed (e.g., mounted) on a circuit board or may be electrically connected to the circuit board through a flexible circuit board. In an exemplary embodiment, the circuit board may be a printed circuit board PCB, for example.

The power module PSM may supply power necessary for overall operations of the electronic device ED. The power module PSM may include a general battery device.

The housing HM may be coupled to the display module DM (e.g., the window WM) to receive the other modules. The housing HM including one member is illustrated as an example in FIG. 2. However, the invention is not limited thereto, and in an alternative exemplary embodiment, the housing HM may include two or more parts assembled with each other.

Figure 4A:
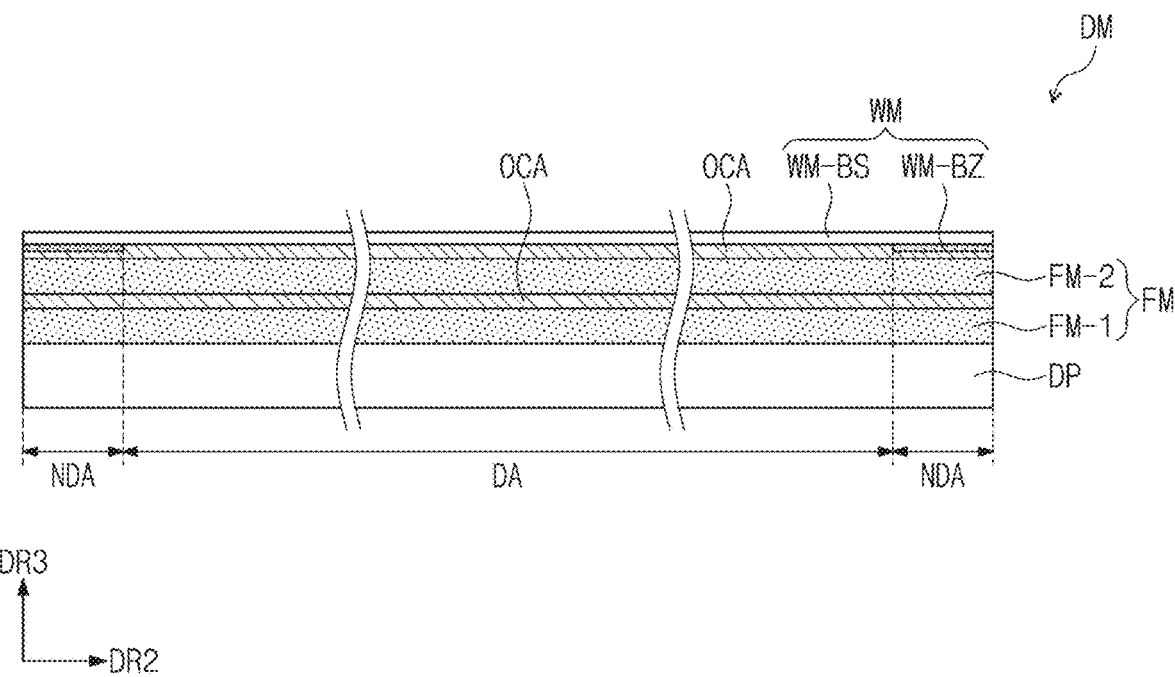
FIGS. 4A and 4B are cross-sectional views illustrating an exemplary embodiment of display modules according to the invention.
Figure 4B:
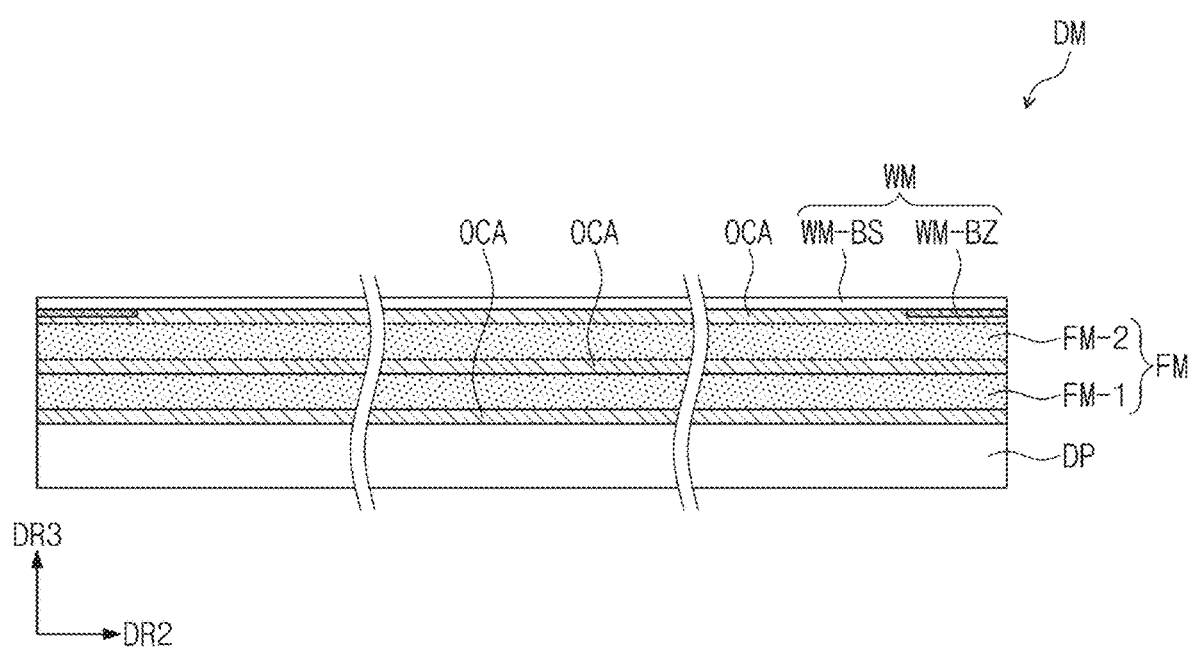

FIGS. 4A and 4B are cross-sectional views illustrating exemplary embodiments of display modules DM according to the invention. Hereinafter, the detailed descriptions to the same components as in FIGS. 1 to 3 will be omitted for the purpose of ease and convenience in description.

As illustrated in FIG. 4A, the display module DM may include the display panel DP, an input detection sensor FM-1, an anti-reflector FM-2, and the window WM. The input detection sensor FM-1 may be provided in a layer type and may be disposed directly on a base surface provided by the display panel DP. Hereinafter, a layer type input detection sensor FM-1 is described as an input sensing layer. In the specification, it is understood that when a component 'B' is disposed directly on a component 'A', an additional adhesive layer/adhesive member is not disposed between the component 'A' and the component 'B'. In other words, the term "directly" means that there are no intervening components. After formation of the component 'A', the component 'B' is formed on a base surface, provided by the component 'A', through continuous processes.

The anti-reflector FM-2 may include at least a polarizing film. The polarizing film may be an elongated polarizer. In an exemplary embodiment, the anti-reflector FM-2 may include a λ/4 retarder film, for example. In an exemplary embodiment, the anti-reflector FM-2 may further include a λ/2 retarder film, for example. In an exemplary embodiment, the λ/4 retarder film and the λ/2 retarder film may be elongated retarders, for example. In an exemplary embodiment, the polarizer and the retarder may be coupled by an adhesive member, for example.

The input detection sensor FM-1, the anti-reflector FM-2 and the window WM may be coupled to each other through adhesive members OCA.

As illustrated in FIG. 4B, in another exemplary embodiment, the input detection sensor FM-1 may be provided in a panel type and may be coupled to the display panel DP through an adhesive member. The panel type may include a base layer providing a base surface. In an exemplary embodiment, the base layer may be a synthetic resin film, a composite material film, or a glass substrate, for example.

The layer type may not include the base layer. In other words, the unit represented as the layer is disposed on a base surface provided by another unit.

The window WM may include a base substrate WM-BS and a bezel pattern WM-BZ. The base substrate WM-BS may include a transparent substrate such as a glass substrate. In an alternative exemplary embodiment, the base substrate WM-BS may include reinforced plastic. The bezel pattern WM-BZ may include a colored organic layer and may substantially define the non-display area NDA of FIG. 1. In an exemplary embodiment, the bezel pattern WM-BZ may have a multi-layered structure. In an exemplary embodiment, the multi-layered structure may include a colored layer and a light blocking layer having a black color, for example.

Even though not shown in the drawings, the input detection sensor FM-1 and the anti-reflector FM-2 of the display module DM may be omitted in a certain embodiment. In this case, a window layer may be disposed directly on the display panel DP through continuous processes.

Figure 5A:
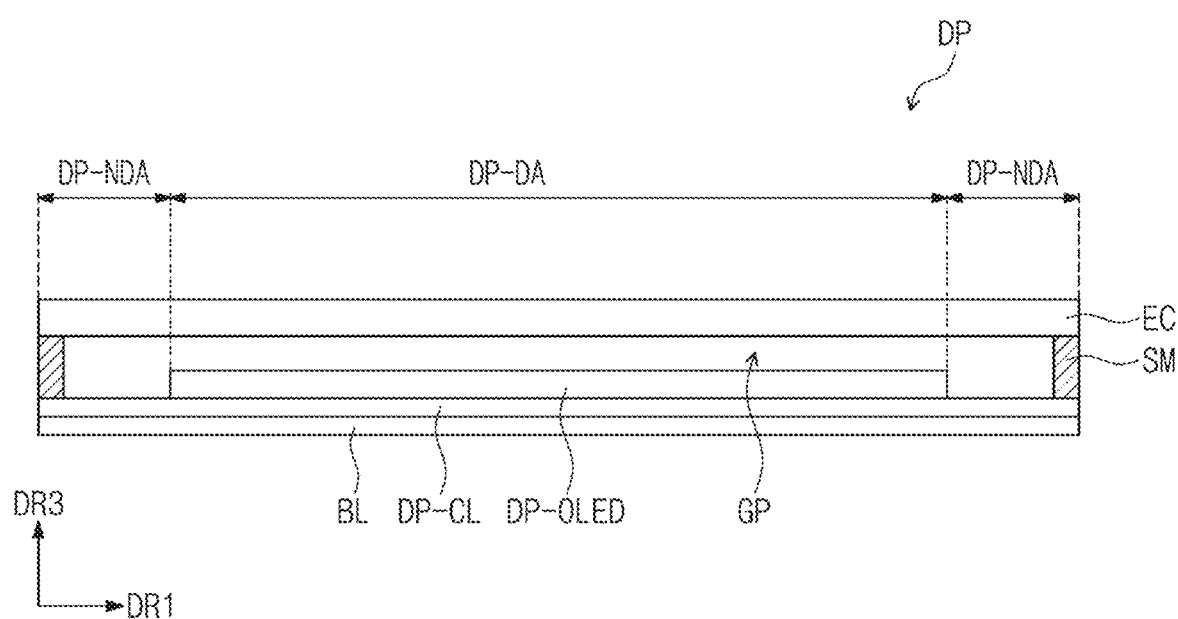
FIG. 5A is a cross-sectional view illustrating an exemplary embodiment of a display panel according to the invention.
Figure 5B:
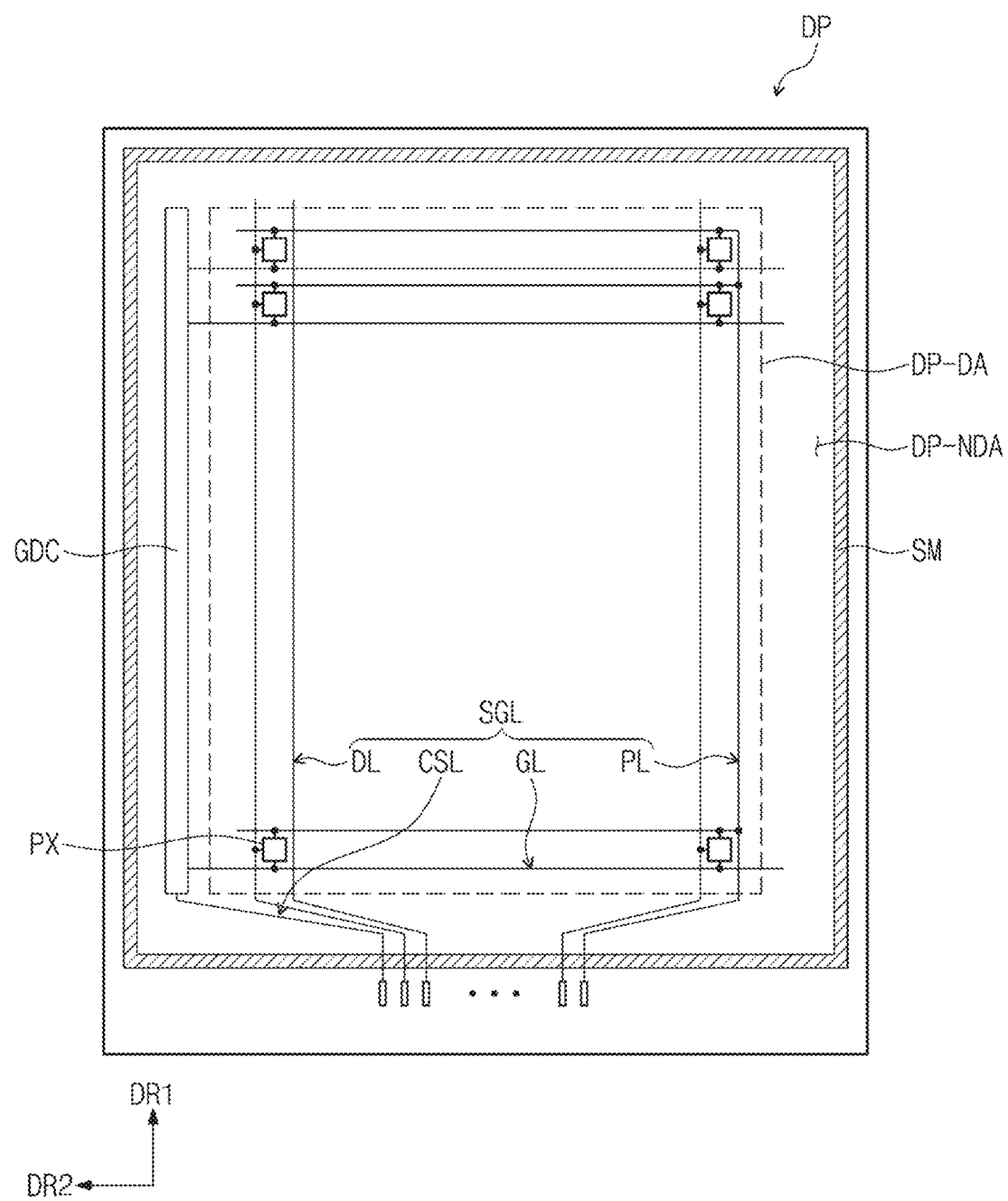
FIG. 5B is a plan view illustrating an exemplary embodiment of a display panel according to the invention.
Figure 5C:
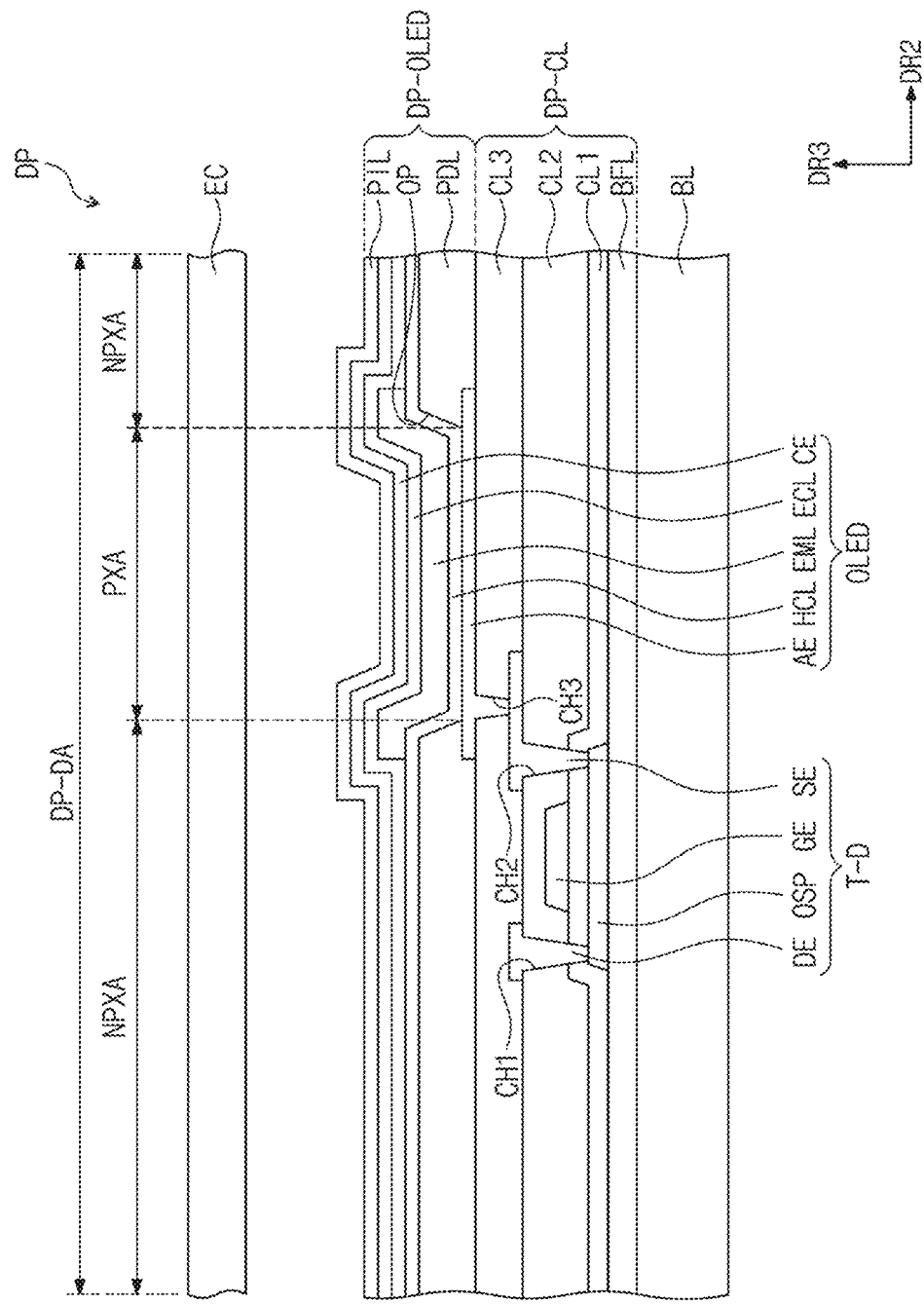
FIG. 5C is an enlarged cross-sectional view illustrating an exemplary embodiment of a display panel according to the invention.
Figure 5D:
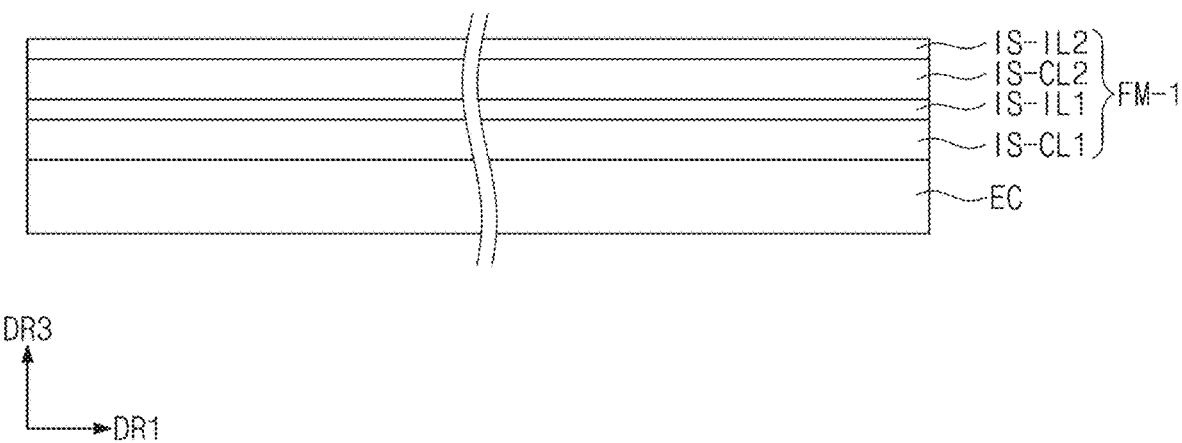
FIG. 5D is a cross-sectional view illustrating an exemplary embodiment of an input sensing layer according to the invention.
Figure 5E:
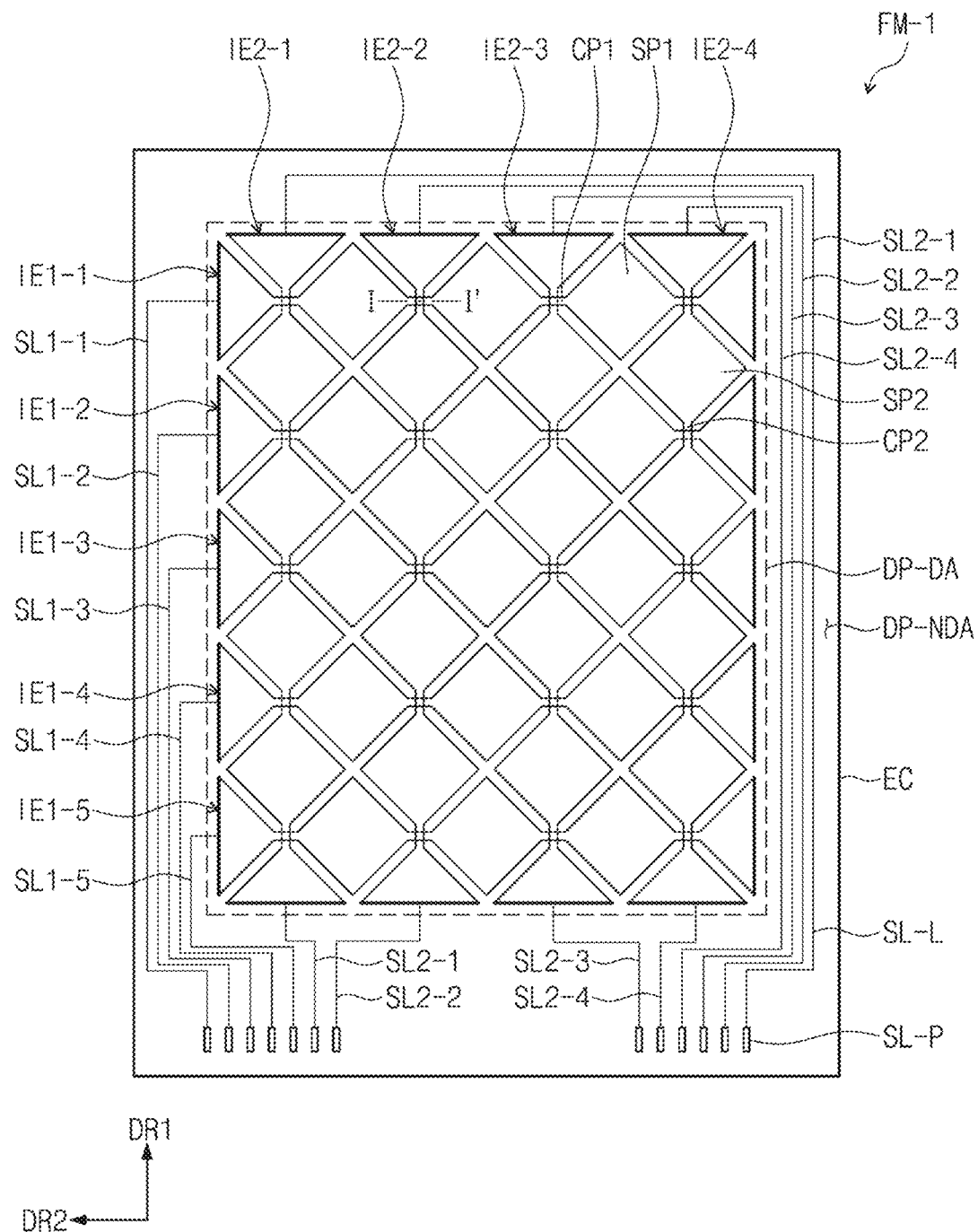
FIG. 5E is a plan view illustrating an exemplary embodiment of an input sensing layer according to the invention.
Figure 5F:
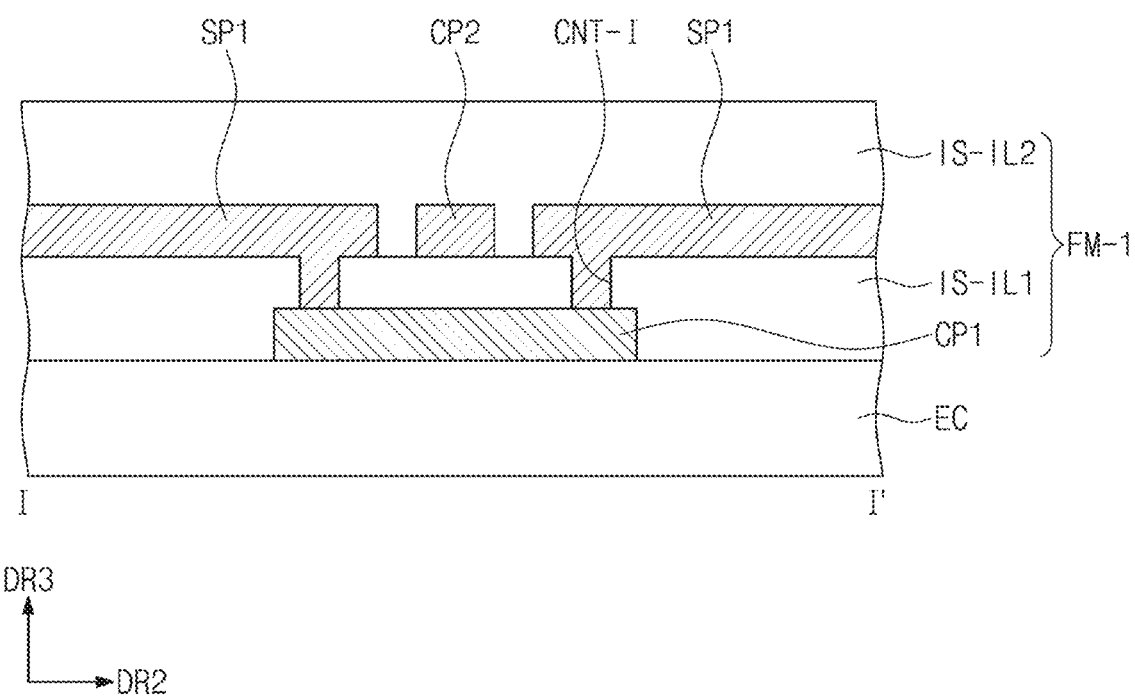
FIG. 5F is a partial cross-sectional view illustrating an exemplary embodiment of an input sensing layer according to the invention.

FIG. 5A is a cross-sectional view illustrating an exemplary embodiment of the display panel DP according to the invention. FIG. 5B is a plan view illustrating an exemplary embodiment of the display panel DP according to the invention. FIG. 5C is an enlarged cross-sectional view illustrating an exemplary embodiment of the display panel DP according to the invention. FIG. 5D is a cross-sectional view illustrating an exemplary embodiment of an input sensing layer FM-1 according to the invention. FIG. 5E is a plan view illustrating an exemplary embodiment of the input sensing layer FM-1 according to the invention. FIG. 5F is a partial cross-sectional view illustrating an exemplary embodiment of the input sensing layer FM-1 according to the invention.

As illustrated in FIG. 5A, the display panel DP may include a base layer BL, a circuit element layer DP-CL disposed on the base layer BL, a display element layer DP-OLED disposed on the circuit element layer DP-CL, an encapsulation substrate EC, and a sealing member SM.

The base layer BL may include a glass substrate. In an alternative exemplary embodiment, the base layer BL may include a substrate having a substantially constant refractive index in a wavelength range of visible light.

The circuit element layer DP-CL may include at least one insulating layer and a circuit element. Hereinafter, the insulating layer included in the circuit element layer DP-CL is referred to as an intermediate insulating layer. The intermediate insulating layer may include at least one intermediate inorganic layer and/or at least one intermediate organic layer. The circuit element may include a signal line and a driving circuit of a pixel.

The display element layer DP-OLED may include a light emitting element. The display element layer DP-OLED may include organic light emitting diodes as the light emitting elements. The display element layer DP-OLED may include a pixel defining layer including, for example, an organic material.

A protective layer PIL (refer to FIG. 5C) may be disposed on the light emitting elements (e.g., the organic light emitting diodes). The protective layer PIL may protect a second electrode CE (refer to FIG. 5C) of the organic light emitting diodes. In an exemplary embodiment, the protective layer PIL may include an inorganic material such as silicon oxide, silicon nitride, and/or silicon oxynitride.

The encapsulation substrate EC may be a transparent substrate. The encapsulation substrate EC may include a glass substrate. In an alternative exemplary embodiment, the encapsulation substrate EC may include a substrate having a substantially constant refractive index in a wavelength range of visible light.

A stack structure of the base layer BL, the circuit element layer DP-CL and the display element layer DP-OLED may be defined as a lower display substrate. The sealing member SM may couple the lower display substrate to the encapsulation substrate EC. The sealing member SM may extend along an edge of the encapsulation substrate EC.

The sealing member SM may overlap a non-display area DP-NDA of the display panel DP. The non-display area DP-NDA of the display panel DP is an area in which a pixel PX to be described later is not provided. The non-display area DP-NDA of the display panel DP may overlap the non-display area NDA of the electronic device ED illustrated in FIG. 1. In an exemplary embodiment, a width of the non-display area DP-NDA may range from about 0.5 millimeter (mm) to about 2 mm, for example. This width may be a width measured in the second direction DR2 at each of a left side and a right side of a display area DP-DA of the display panel DP. A width of the sealing member SM may be less than the width of the non-display area DP-NDA. In an exemplary embodiment, the width of the sealing member SM may range from about 200 micrometers (μm) to about 700 μm, for example.

A gap GP between the lower display substrate and the encapsulation substrate EC may be defined by the sealing member SM. The gap GP may be filled with air or an inert gas. Hereinafter, the air or inert gas is referred to as an external gas. The encapsulation substrate EC and the sealing member SM may prevent moisture from permeating to the lower display substrate. As shown in FIG. 5A, the sealing member SM may contact the circuit element layer DP-CL. However, the invention is not limited thereto, and in another exemplary embodiment of the invention, the sealing member SM may be coupled directly to a top surface of the base layer BL and a bottom surface of the encapsulation substrate EC.

The sealing member SM may include an inorganic adhesive member such as frit. In an alternative exemplary embodiment, the sealing member SM may include an organic adhesive member. In the exemplary embodiment, the display panel DP may be completely sealed or encapsulated from the outside, and thus strength of the display panel DP may be improved and a defect of the light emitting element may be prevented.

As illustrated in FIG. 5B, the display panel DP may include a driving circuit GDC, a plurality of signal lines SGL, and a plurality of pixels PX. The pixels PX may be disposed in the display area DP-DA. Each of the pixels PX may include the light emitting element and a pixel driving circuit connected to the light emitting element. The driving circuit GDC, the signal lines SGL and the pixel driving circuits may be included in the circuit element layer DP-CL illustrated in FIG. 5A.

The driving circuit GDC may include a scan driving circuit. The scan driving circuit may generate a plurality of scan signals and may sequentially output the scan signals to a plurality of scan lines GL to be described below. The scan driving circuit may further output other control signals to the pixel driving circuits of the pixels PX.

The scan driving circuit may include a plurality of thin film transistors provided by the same process (e.g., a low-temperature polycrystalline silicon ("LTPS") process or a low-temperature polycrystalline oxide ("LTPO") process) as the pixel driving circuits of the pixels PX.

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may provide control signals to the scan driving circuit.

The signal lines SGL may be connected to a circuit board (not shown). The signal lines SGL may be connected to a timing control circuit disposed (e.g., mounted) on the circuit board in the form of an integrated chip ("IC"). In an exemplary embodiment of the invention, the IC may be connected to the signal lines SGL disposed in the non-display area DP-NDA.

As illustrated in FIG. 5C, the circuit element layer DP-CL may include a buffer layer BFL corresponding to an inorganic layer, a first intermediate inorganic layer CL1, a second intermediate inorganic layer CL2, and an intermediate organic layer CL3. In FIG. 5C, an arrangement relationship of a semiconductor pattern OSP, a control electrode GE, an input electrode DE and an output electrode SE of a driving transistor T-D is illustrated as an example. First and second through-holes CH1 and CH2 are also illustrated as an example.

The display element layer DP-OLED may include the light emitting element. The display element layer DP-OLED may include the organic light emitting diode OLED as the light emitting element. The display element layer DP-OLED may include a pixel defining layer PDL. In an exemplary embodiment, the pixel defining layer PDL may be an organic layer, for example.

A first electrode AE may be disposed on the intermediate organic layer CL3. The first electrode AE may be connected to the output electrode SE through a third through-hole CH3 penetrating the intermediate organic layer CL3. An opening OP may be defined in the pixel defining layer PDL. The opening OP of the pixel defining layer PDL may expose at least a portion of the first electrode AE. The opening OP of the pixel defining layer PDL is defined as an emission opening to be distinguished from other openings.

The display area DP-DA of the display panel DP may include a light emitting area PXA and a non-light emitting area NPXA adjacent to the light emitting area PXA. The non-light emitting area NPXA may surround the light emitting area PXA. In the illustrated exemplary embodiment, the light emitting area PXA is defined to correspond to a partial area of the first electrode AE, which is exposed through the emission opening OP.

A hole control layer HCL may be disposed in common in the light emitting area PXA and the non-light emitting area NPXA. The hole control layer HCL may include a hole transfer layer and may further include a hole injection layer. An emission layer EML may be disposed on the hole control layer HCL. The emission layer EML may be disposed in an area corresponding to the emission opening OP. In other words, the emission layers EML of the pixels PX may be separated from each other. The emission layer EML may include an organic material and/or an inorganic material. The emission layer EML may generate light having a predetermined color.

An electron control layer ECL may be disposed on the emission layer EML. The electron control layer ECL may include an electron transfer layer and may further include an electron injection layer. The hole control layer HCL and the electron control layer ECL may be provided in common in the plurality of pixels PX by an open mask. A second electrode CE may be disposed on the electron control layer ECL. The second electrode CE may be disposed in common in the plurality of pixels PX.

In FIG. 5D, the components of the display panel DP (refer to FIG. 5C) under the encapsulation substrate EC are omitted to describe a stack structure of the input sensing layer FM-1. A top surface of the encapsulation substrate EC may be provided as a base surface on which the input sensing layer FM-1 is disposed directly.

The input sensing layer FM-1 may include at least sensing electrodes and at least one insulating layer. The input sensing layer FM-1 may further include a signal line connected to the sensing electrode and at least one insulating layer. The input sensing layer FM-1 may sense an external input by, for example, a capacitive method.

As illustrated in FIG. 5D, in an exemplary embodiment, the input sensing layer FM-1 according to the invention may include a first conductive layer IS-CL1, a first insulating layer IS-ILL a second conductive layer IS-CL2, and a second insulating layer IS-IL2. Each of the first and second conductive layers IS-CL1 and IS-CL2 may have a single-layered structure or may have a multi-layered structure including a plurality of layers stacked along the third direction DR3. The conductive layer of the single-layered structure may include a metal layer or a transparent conductive layer. In an exemplary embodiment, the metal layer may include molybdenum, silver, titanium, copper, aluminum, or any alloy thereof, for example. In an exemplary embodiment, the transparent conductive layer may include a transparent conductive oxide such as indium tin oxide ("ITO"), indium zinc oxide ("IZO"), zinc oxide (ZnO), or indium tin zinc oxide ("ITZO"). In an alternative exemplary embodiment, the transparent conductive layer may include a conductive polymer (e.g., "PEDOT"), a metal nanowire, or graphene, for example.

The conductive layer of the multi-layered structure may include a plurality of metal layers. In an exemplary embodiment, the plurality of metal layers may have a three-layer structure of titanium/aluminum/titanium, for example. In certain embodiments, the conductive layer of the multi-layered structure may include at least one metal layer and at least one transparent conductive layer.

Each of the first and second conductive layers IS-CL1 and IS-CL2 may include a plurality of patterns. The first conductive layer IS-CL1 may include first conductive patterns, and the second conductive layer IS-CL2 may include second conductive patterns. The first conductive patterns may include sensing electrodes and signal lines, and the second conductive patterns may include sensing electrodes and signal lines.

Each of the first and second insulating layers IS-IL1 and IS-IL2 may include an inorganic material, an organic material, or a composite material. At least one of the first insulating layer IS-IL1 and the second insulating layer IS-IL2 may include an inorganic layer. In an exemplary embodiment, the inorganic layer may include at least one of aluminum oxide, titanium oxide, silicon oxide, silicon oxynitride, zirconium oxide, and hafnium oxide, for example.

At least one of the first insulating layer IS-IL1 and the second insulating layer IS-IL2 may include an organic layer. In an exemplary embodiment, the organic layer may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin, for example.

As illustrated in FIG. 5E, the input sensing layer FM-1 may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. Even though not shown in the drawings, the input sensing layer FM-1 may further include an optical dummy electrode disposed at a boundary area between the first sensing electrodes IE1-1 to IE1-5 and the second sensing electrodes IE2-1 to IE2-4.

The first sensing electrodes IE1-1 to IE1-5 may intersect the second sensing electrodes IE2-1 to IE2-4. The first sensing electrodes IE1-1 to IE1-5 may be arranged in the first direction DR1, and each of the first sensing electrodes IE1-1 to IE1-5 may extend in the second direction DR2. In an exemplary embodiment, an external input may be sensed by a mutual capacitance method and/or a self-capacitance method, for example. In an exemplary embodiment, coordinates of the external input may be calculated during a first period by the mutual capacitance method, and then, the coordinates of the external input may be re-calculated during a second period by a self-capacitance method.

Each of the first sensing electrodes IE1-1 to IE1-5 may include first sensor parts SP1 and first connection parts CP1. Each of the second sensing electrodes IE2-1 to IE2-4 may include second sensor parts SP2 and second connection parts CP2.

However, the invention is not limited to the shapes of the first and second sensing electrodes IE1-1 to IE1-5 and IE2-1 to IE2-4 illustrated in FIG. 5E. In another exemplary embodiment of the invention, each of the first and second sensing electrodes IE1-1 to IE1-5 and IE2-1 to IE2-4 may have a shape (e.g., a bar shape) without distinction between a sensor part and a connection part. In the illustrated exemplary embodiment, the first sensor parts SP1 and the second sensor parts SP2 having diamond shapes are illustrated as an example. However, the invention is not limited thereto. In another exemplary embodiment, the first sensor parts SP1 and the second sensor parts SP2 may have another polygonal shape.

In each of the first sensing electrodes IE1-1 to IE1-5, the first sensor parts SP1 may be arranged in the second direction DR2. In each of the second sensing electrodes IE2-1 to IE2-4, the second sensor parts SP2 may be arranged in the first direction DR1. Each of the first connection parts CP1 may connect the first sensor parts SP1 adjacent to each other, and each of the second connection parts CP2 may connect the second sensor parts SP2 adjacent to each other.

Each of the first signal lines SL1-1 to SL1-5 may be connected to one end of each of the first sensing electrodes IE1-1 to IE1-5. A pair of the second signal lines SL2-1, SL2-2, SL2-3 or SL2-4 may be connected to both ends of each of the second sensing electrodes IE2-1 to IE2-4, respectively. In another exemplary embodiment, a pair of the first signal lines may be connected to both ends of each of the first sensing electrodes IE1-1 to IE1-5, respectively. In another exemplary embodiment, each of the second signal lines SL2-1 to SL2-4 may be connected to one end of each of the second sensing electrodes IE2-1 to IE2-4.

According to the illustrated exemplary embodiment, sensing sensitivity of the input sensing layer FM-1 may be improved since the both ends of each of the second sensing electrodes IE2-1 to IE2-4 are connected to the second signal lines SL2-1, SL2-2, SL2-3 or SL2-4, respectively. Since lengths of the second sensing electrodes IE2-1 to IE2-4 taken along the first direction DR1 are greater than lengths of the first sensing electrodes IE1-1 to IE1-5 taken along the second direction DR2, a voltage drop of a detected signal (or a transmitted signal) may occur, and thus sensing sensitivity may be reduced. However, according to the illustrated exemplary embodiment, the detected signal (or the transmitted signal) may be provided through the second signal lines SL2-1, SL2-2, SL2-3 or SL2-4 connected to the both ends of each of the second sensing electrodes IE2-1 to IE2-4, and thus the voltage drop of the detected signal (or the transmitted signal) may be prevented to prevent the sensing sensitivity from being reduced.

Each of the first and second signal lines SL1-1 to SL1-5 and SL2-1 to SL2-4 may include a line portion SL-L and a pad portion SL-P. The pad portions SL-P may be arranged in a pad area.

In an exemplary embodiment, the first signal lines SL1-1 to SL1-5 and the second signal lines SL2-1 to SL2-4 may be replaced with a circuit board which is separately manufactured and is coupled to the input sensing layer FM-1.

As illustrated in FIG. 5F, the first conductive layer IS-CL1 may include the first connection parts CP1. The second conductive layer IS-CL2 may include the first sensor parts SP1 and the second connection parts CP2. The second conductive layer IS-CL2 may further include the second sensor parts SP2 (refer to FIG. 5E). Each of the second sensing electrodes IE2-1 to IE2-4 may have a single unitary body shape. The first sensor parts SP1 may be spaced apart from the second sensing electrodes IE2-1 to IE2-4. The first sensor parts SP1 adjacent to each other may be connected to the first connection part CP1 through contact holes CNT-I penetrating the first insulating layer IS-IL1.

Conductive patterns disposed in the same layer may be provided by the same process, may include the same material, and may have the same stack structure. The stacking order of the components of the input sensing layer FM-1 described above may be changed. In another exemplary embodiment, the first sensor parts SP1 and the second connection part CP2 may be disposed directly on the encapsulation substrate EC. The first insulating layer IS-IL1 may be disposed on the encapsulation substrate EC to cover the first sensor parts SP1 and the second connection part CP2. The first connection part CP1 may be disposed on the first insulating layer IS-IL1 and may be electrically connected to the first sensor parts SP1 through the contact holes CNT-I penetrating the first insulating layer IS-IL1. In the illustrated exemplary embodiment, the input sensing layer FM-1 having a two-layer structure is described as an example. However, the invention is not limited thereto, and in an alternative exemplary embodiment, the input sensing layer FM-1 may have a one-layer structure driven by a self-capacitance method.

Figure 6A:
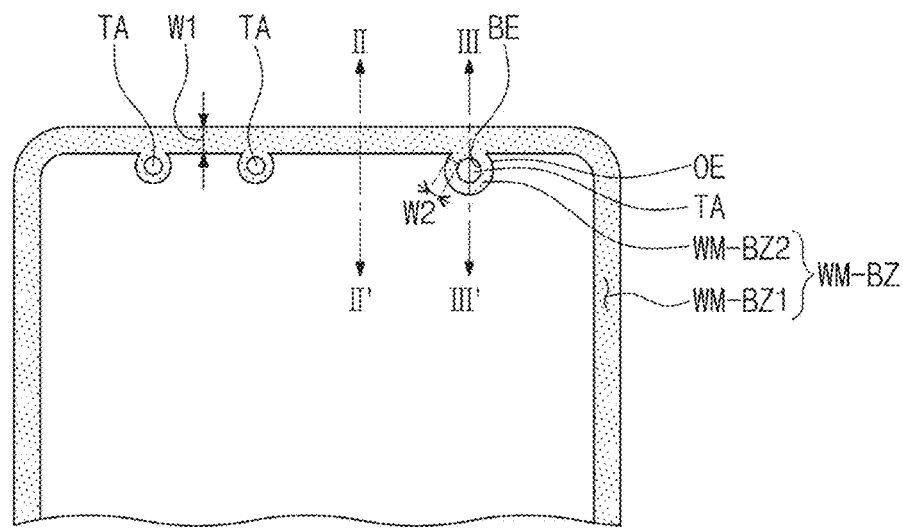
FIG. 6A is a partial plan view illustrating an exemplary embodiment of a display module according to the invention.
Figure 6B:
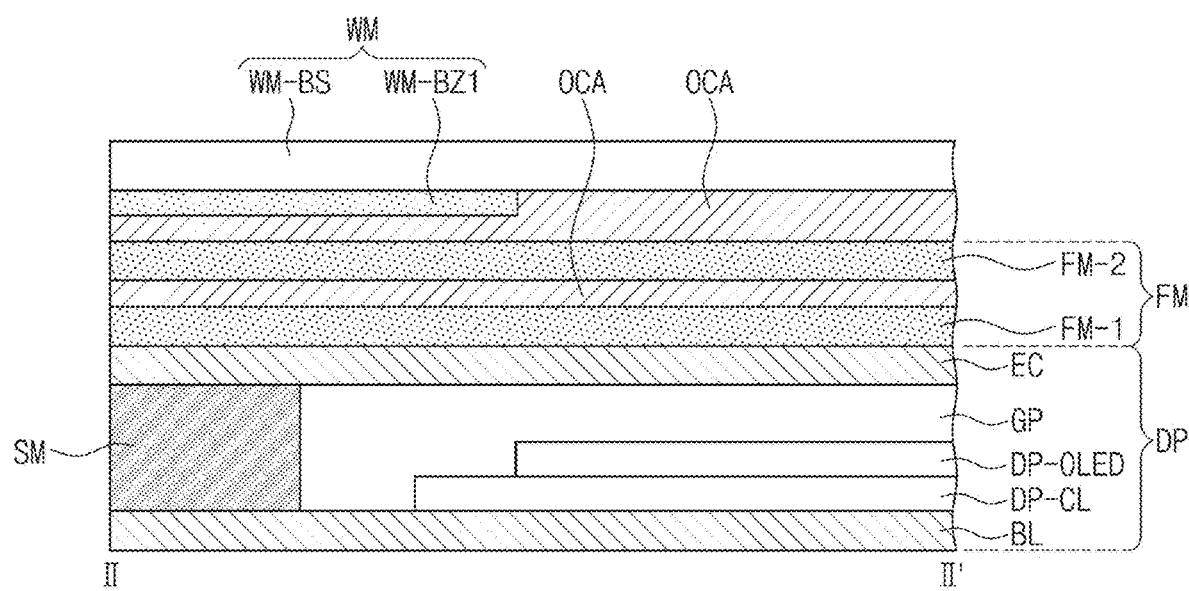
FIGS. 6B and 6C are cross-sectional views illustrating an exemplary embodiment of a display module according to the invention.
Figure 6C:
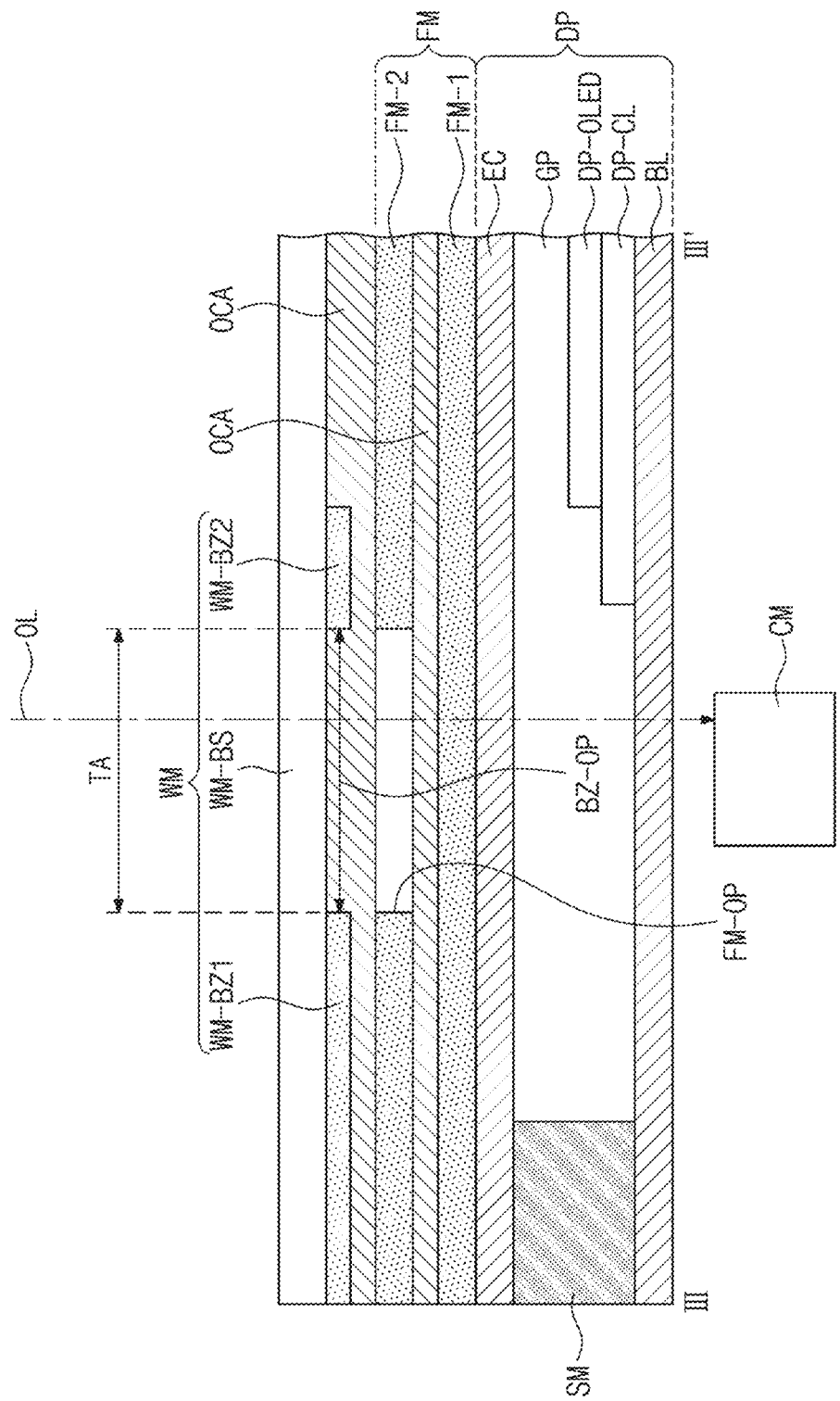

FIG. 6A is a partial plan view illustrating an exemplary embodiment of the display module DM according to the invention. FIGS. 6B and 6C are cross-sectional views illustrating an exemplary embodiment of the display module DM according to the invention. Hereinafter, the detailed descriptions to the same components as in FIGS. 1 to 5E will be omitted for the purpose of ease and convenience in description.

As illustrated in FIG. 6A, the bezel pattern WM-BZ may include a first bezel pattern WM-BZ1 which extends along an edge of the base substrate WM-BS, and a second bezel pattern WM-BZ2 which extends from the first bezel pattern WM-BZ1 and of which at least a portion defines the transmission area TA. In FIG. 6A, the transmission area TA is defined by the second bezel pattern WM-BZ2. In an alternative exemplary embodiment, the transmission area TA may be defined by a combination of the first bezel pattern WM-BZ1 and the second bezel pattern WM-BZ2. This will be described later in detail with reference to FIGS. 10A to 10G.

An opening corresponding to the transmission area TA may be defined in the bezel pattern WM-BZ. The opening may be defined by the second bezel pattern WM-BZ2 or may be defined by the combination of the first bezel pattern WM-BZ1 and the second bezel pattern WM-BZ2.

The first bezel pattern WM-BZ1 may overlap the sealing member SM when viewed in a plan view. Substantially, the first bezel pattern WM-BZ1 may completely cover the sealing member SM.

As illustrated in FIG. 6A, the second bezel pattern WM-BZ2 may include a curved area when viewed in a plan view. In an exemplary embodiment, a width W2 of the second bezel pattern WM-BZ2 may be equal to or less than about 70 percent (%) of a width W1 of the first bezel pattern WM-BZ1. In an exemplary embodiment, the width W1 of the first bezel pattern WM-BZ1 may range from about 0.5 mm to about 2 mm, and the width W2 of the second bezel pattern WM-BZ2 may range from about 0.2 mm to about 0.8 mm, for example.

An inner line BE of the second bezel pattern WM-BZ2, which defines the transmission area TA, may define a substantially circular shape. An outer line OE of the second bezel pattern WM-BZ2 may define a portion of a substantially circular shape.

As illustrated in FIG. 6B, a portion of the circuit element layer DP-CL may overlap the first bezel pattern WM-BZ1. Signal lines may be disposed in the portion of the circuit element layer DP-CL, which overlaps the first bezel pattern WM-BZ1. Circuit patterns constituting the driving circuit GDC of FIG. 5B may be disposed in the portion of the circuit element layer DP-CL, which overlaps the first bezel pattern WM-BZ1. The circuit patterns may include a transistor, a capacitor, and a signal line. The display element layer DP-OLED (in particular, the light emitting elements) may not overlap the first bezel pattern WM-BZ1.

As illustrated in FIG. 6C, the opening BZ-OP of the bezel pattern WM-BZ may be defined by the inner line BE (refer to FIG. 6A).

The circuit element layer DP-CL may not overlap the transmission area TA. A portion of the circuit element layer DP-CL may overlap the second bezel pattern WM-BZ2. Signal lines may be disposed in the portion of the circuit element layer DP-CL, which overlaps the second bezel pattern WM-BZ2.

The display element layer DP-OLED may not overlap the transmission area TA. A portion of the display element layer DP-OLED may overlap the second bezel pattern WM-BZ2.

An opening FM-OP corresponding to at least the transmission area TA may be defined in the anti-reflector FM-2. The opening FM-OP may be provided to prevent the intensity of the optical signal from being reduced by the polarizer.

Even though not shown in the drawings, openings may be defined in other members (e.g., the input detection sensor FM-1 and the adhesive members OCA) disposed between the window WM and the display panel DP.

The encapsulation substrate EC may overlap the second bezel pattern WM-BZ2 and the transmission area TA. An opening may not be defined in the encapsulation substrate EC, and thus the display element layer DP-OLED may be protected from external moisture.

The electronic optical module ELM (e.g., the camera module CM) may receive external light through the transmission area TA. Since structures reducing a light transmittance in an area corresponding to the transmission area TA are removed, operation reliability of the electronic optical module ELM may be improved.

Figure 7A:
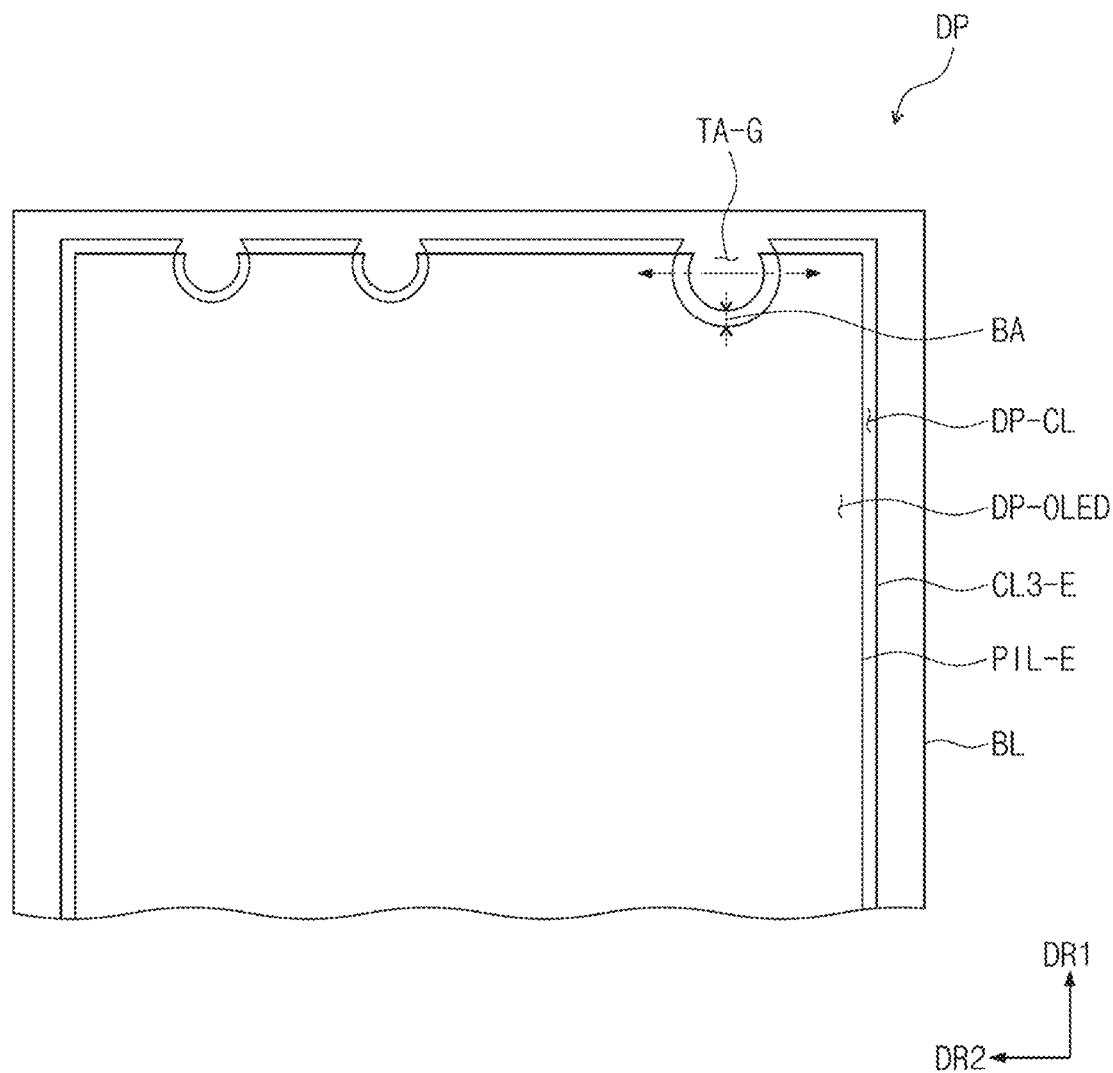
FIG. 7A is a plan view illustrating an exemplary embodiment of a display panel according to the invention.
Figure 7B:
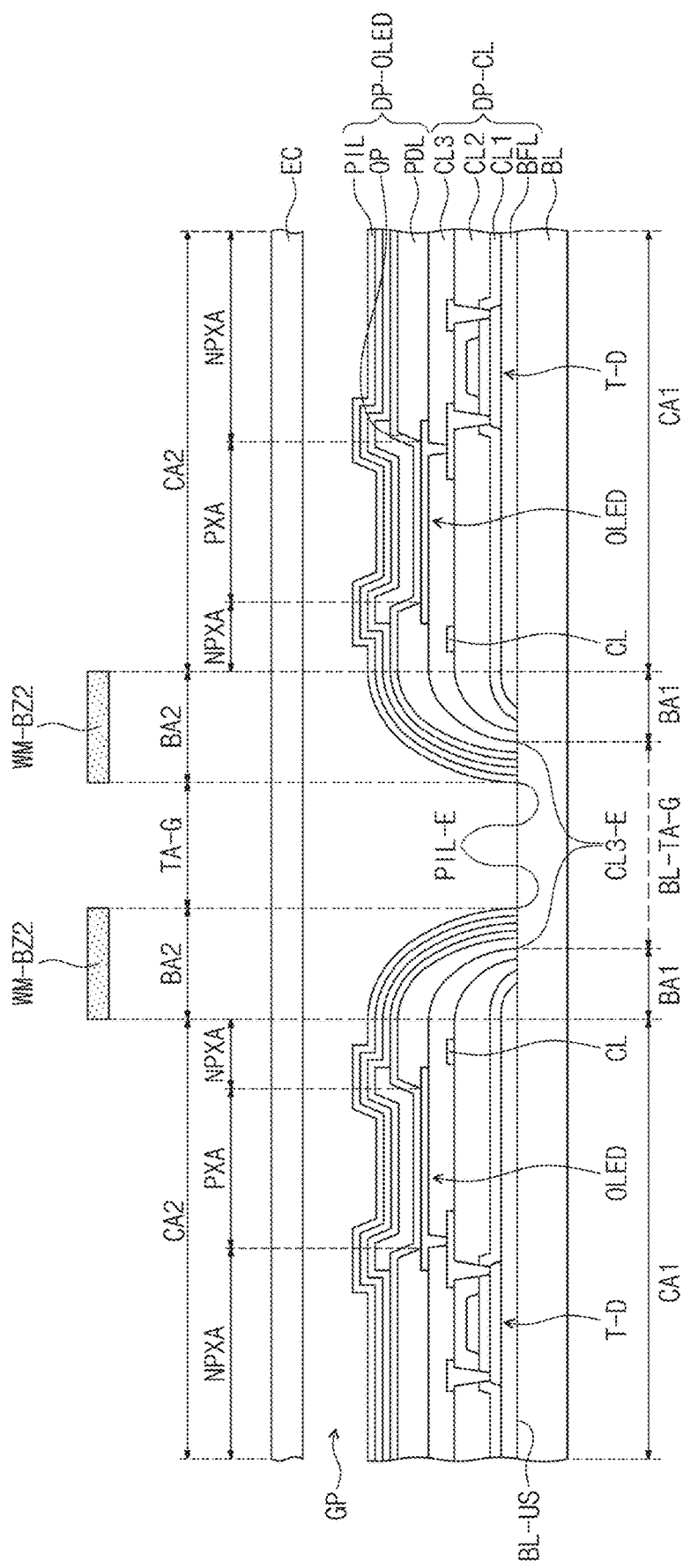
FIGS. 7B and 7C are cross-sectional views illustrating an exemplary embodiment of a display panel according to the invention.
Figure 7C:
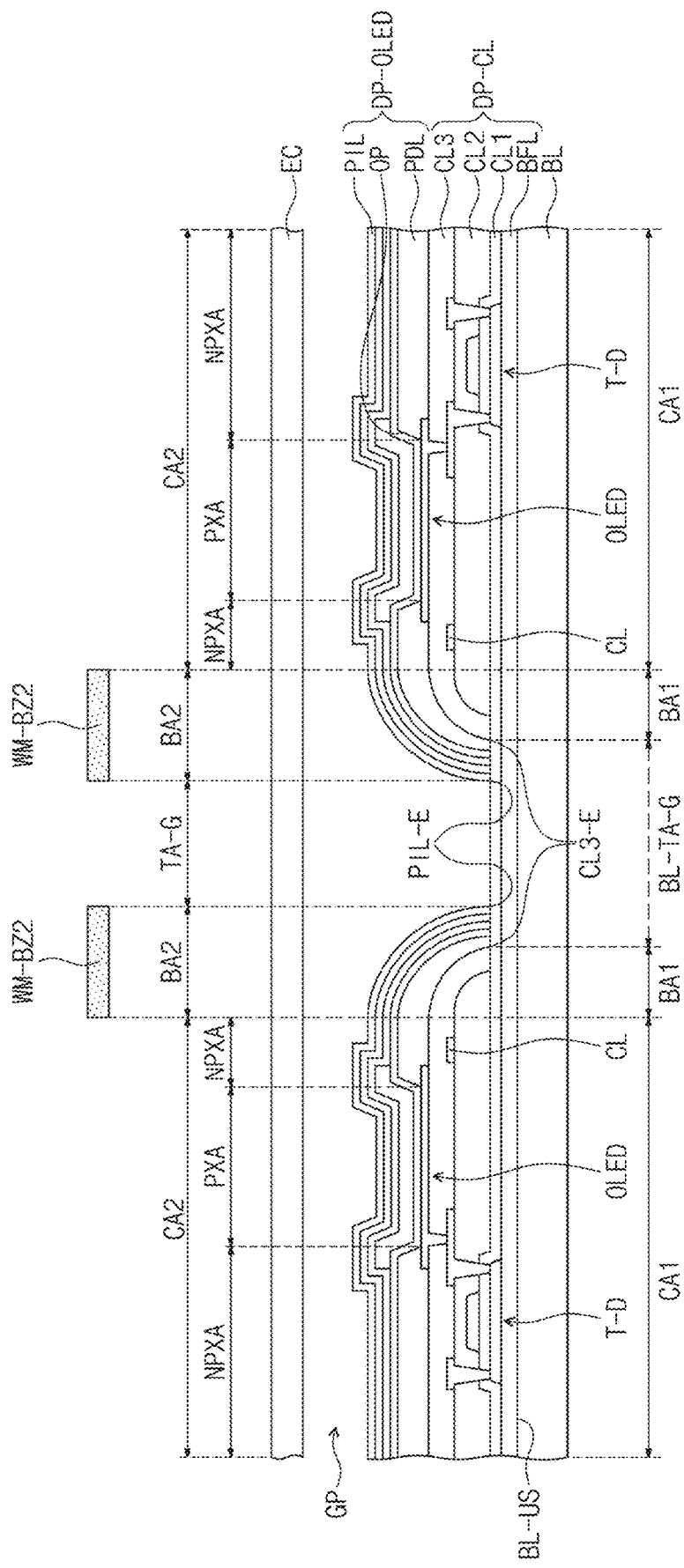

FIG. 7A is a plan view illustrating an exemplary embodiment of the display panel DP according to the invention. FIGS. 7B and 7C are cross-sectional views illustrating an exemplary embodiment of the display panel DP according to the invention. Hereinafter, the detailed descriptions to the same components as in FIGS. 1 to 6C will be omitted for the purpose of ease and convenience in description.

As illustrated in FIGS. 7A and 7B, the circuit element layer DP-CL may expose a partial area TA-G (hereinafter, referred to as 'non-deposition area') of a glass substrate BL (i.e., the base layer), which corresponds to the transmission area TA (refer to FIGS. 6A to 6C). The display element layer DP-OLED may also expose the non-deposition area TA-G of the glass substrate BL, which corresponds to the transmission area TA. The area BA may be an area between an outline of the display element layer DP-OLED and an outline of the circuit element layer DP-CL in a plan view.

The circuit element layer DP-CL may include a circuit area CA1 not overlapping the bezel pattern WM-BZ (refer to FIG. 6C), and a boundary area BA1 overlapping the second bezel pattern WM-BZ2. An edge of the intermediate organic layer CL3 directly covering the transistor T-D may overlap the second bezel pattern WM-BZ2 when viewed in a plan view.

An outer edge CL3-E of the intermediate organic layer CL3 may include a concave region which is concave toward a center of the intermediate organic layer CL3 when viewed in a plan view. The concave region may surround the non-deposition area TA-G. The non-deposition area TA-G may be exposed to the external gas filling the gap GP. A portion BL-TA-G of a top surface BL-US of the glass substrate BL which corresponds to the concave region is exposed from the intermediate organic layer CL3.

A signal line CL may be disposed adjacent to the boundary area BA1. The signal line CL may include the scan line GL (refer to FIG. 5B) or the data line DL (refer to FIG. 5B). Even though not shown in the drawings, in an exemplary embodiment, the signal line CL may be disposed in the boundary area BA1.

The boundary area BA1 (e.g., an area of the boundary area BA1 which does not overlap the signal line CL) may have a thickness along a third direction D3 (refer to FIG. 5C) less than a thickness of the circuit area CA1. This may occur because the boundary area BA1 is provided by a shadow phenomenon in a deposition process. This will be described later in more detail.

The display element layer DP-OLED may include an element area CA2 not overlapping the bezel pattern WM-BZ (refer to FIG. 6C), and a boundary area BA2 overlapping the second bezel pattern WM-BZ2. An edge of the protective layer PIL may overlap the second bezel pattern WM-BZ2 when viewed in a plan view.

An outer edge PIL-E of the protective layer PIL may include a concave region which is concave toward a center of the protective layer PIL when viewed in a plan view. The concave region of the protective layer PIL may surround the non-deposition area TA-G.

The boundary area BA2 may have a thickness along a third direction D3 (refer to FIG. 5C) less than a thickness of the element area CA2. The boundary area BA2 of the display element layer DP-OLED may cover the boundary area BA1 of the circuit element layer DP-CL.

As illustrated in FIG. 7B, an upper insulating layer provided later may seal and encapsulate a lower insulating layer around the non-deposition area TA-G. In an exemplary embodiment, the second intermediate inorganic layer CL2 may seal or encapsulate the first intermediate inorganic layer CL1, for example. The protective layer PIL may seal or encapsulate all insulating layers disposed thereunder around the non-deposition area TA-G.

As illustrated in FIG. 7C, a transparent insulating layer may overlap the transmission area TA (e.g., the non-deposition area TA-G). A metal pattern such as the signal line may not overlap the transmission area TA. As illustrated in FIG. 7C, one or some insulating layers of the circuit element layer DP-CL may overlap the transmission area TA. The buffer layer BFL and the first intermediate inorganic layer CL1 which are transparent inorganic layers are illustrated as an example of the insulating layers overlapping the transmission area TA.

Referring to FIG. 7C, the display element layer DP-OLED may still expose the non-deposition area TA-G of the glass substrate BL.

Figure 8A:
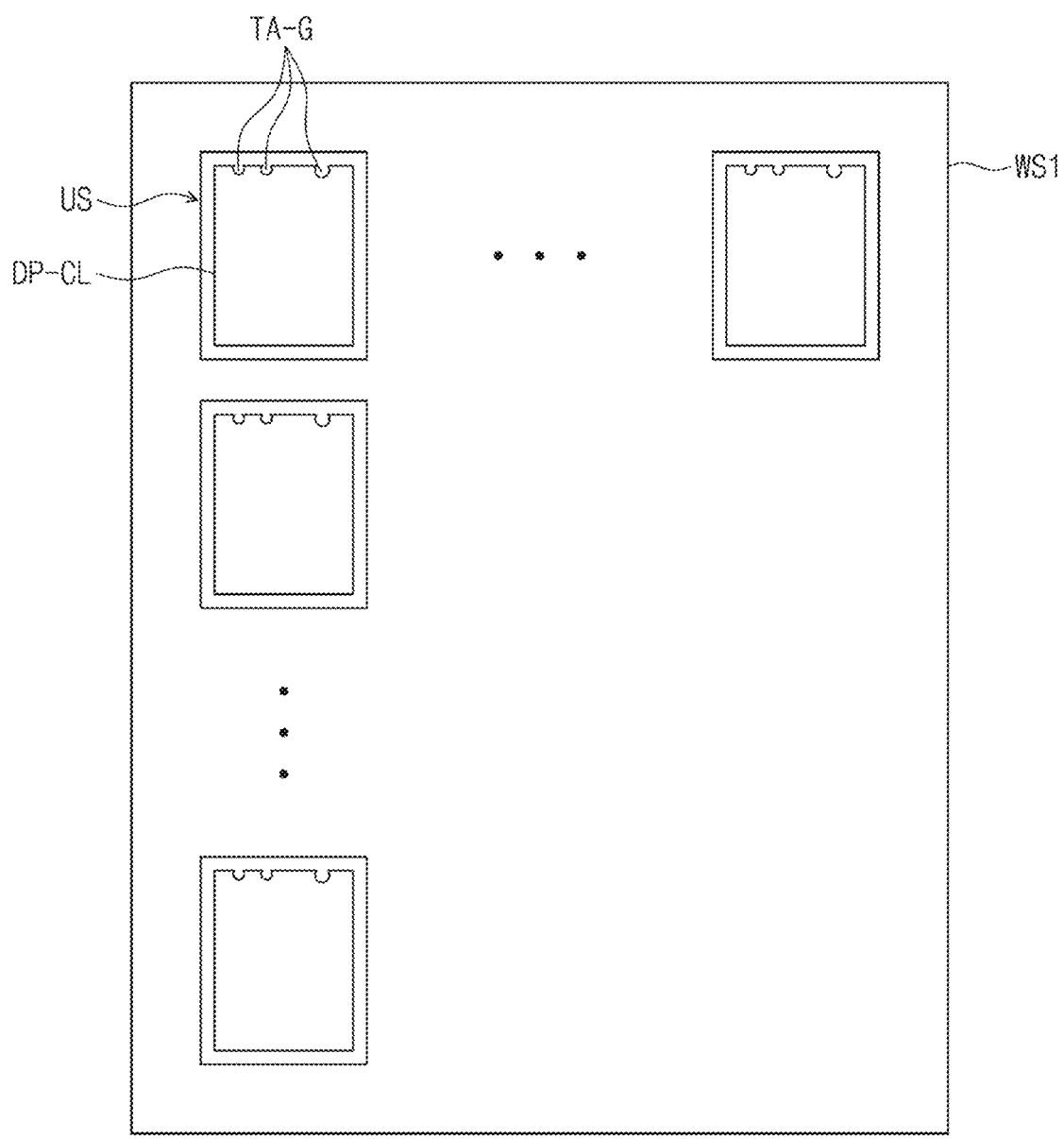
FIG. 8A is a plan view illustrating an exemplary embodiment of a work substrate according to the invention.
Figure 8B:
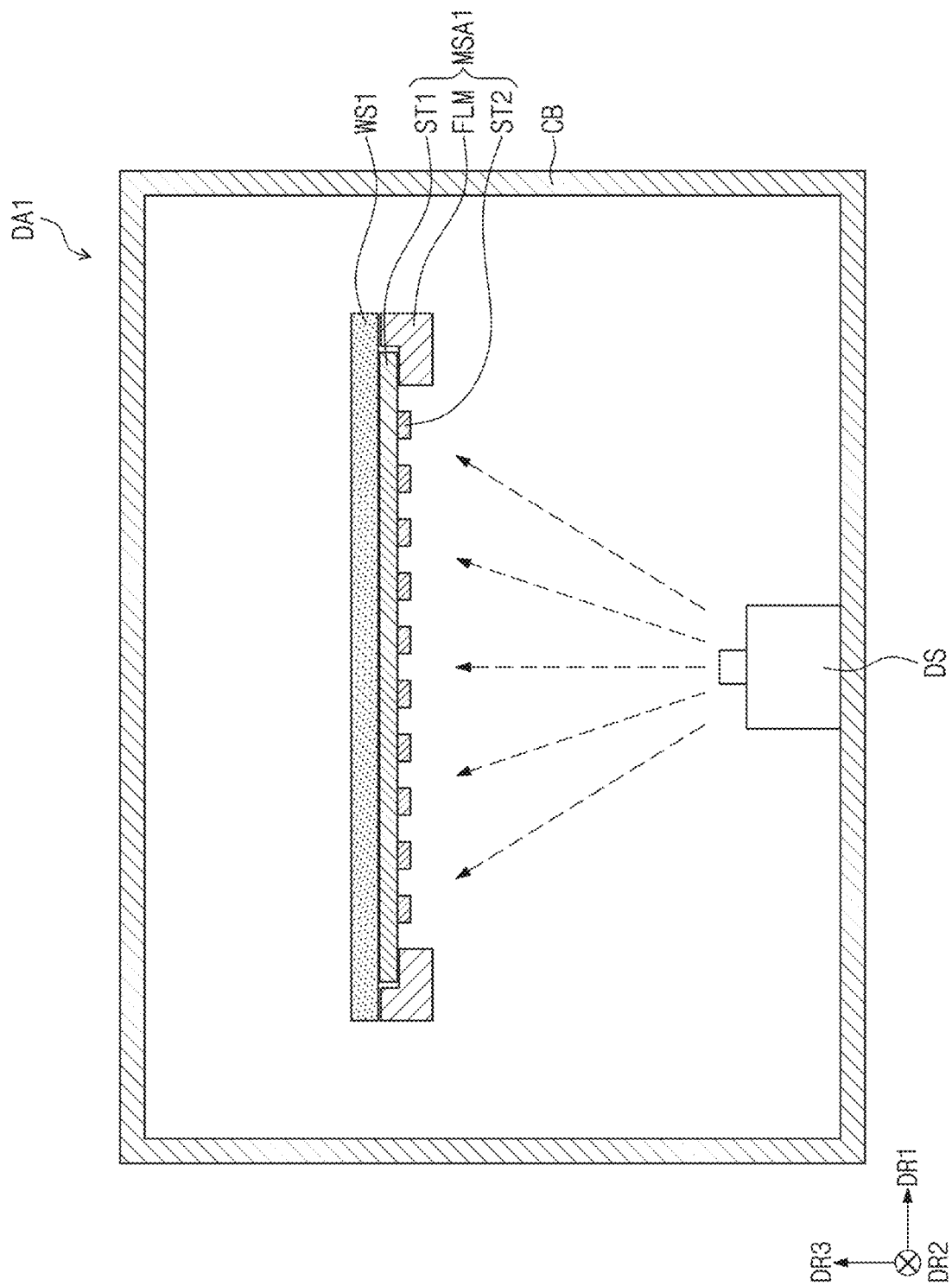
FIG. 8B is a cross-sectional view illustrating an exemplary embodiment of first deposition equipment according to the invention.
Figure 8C:
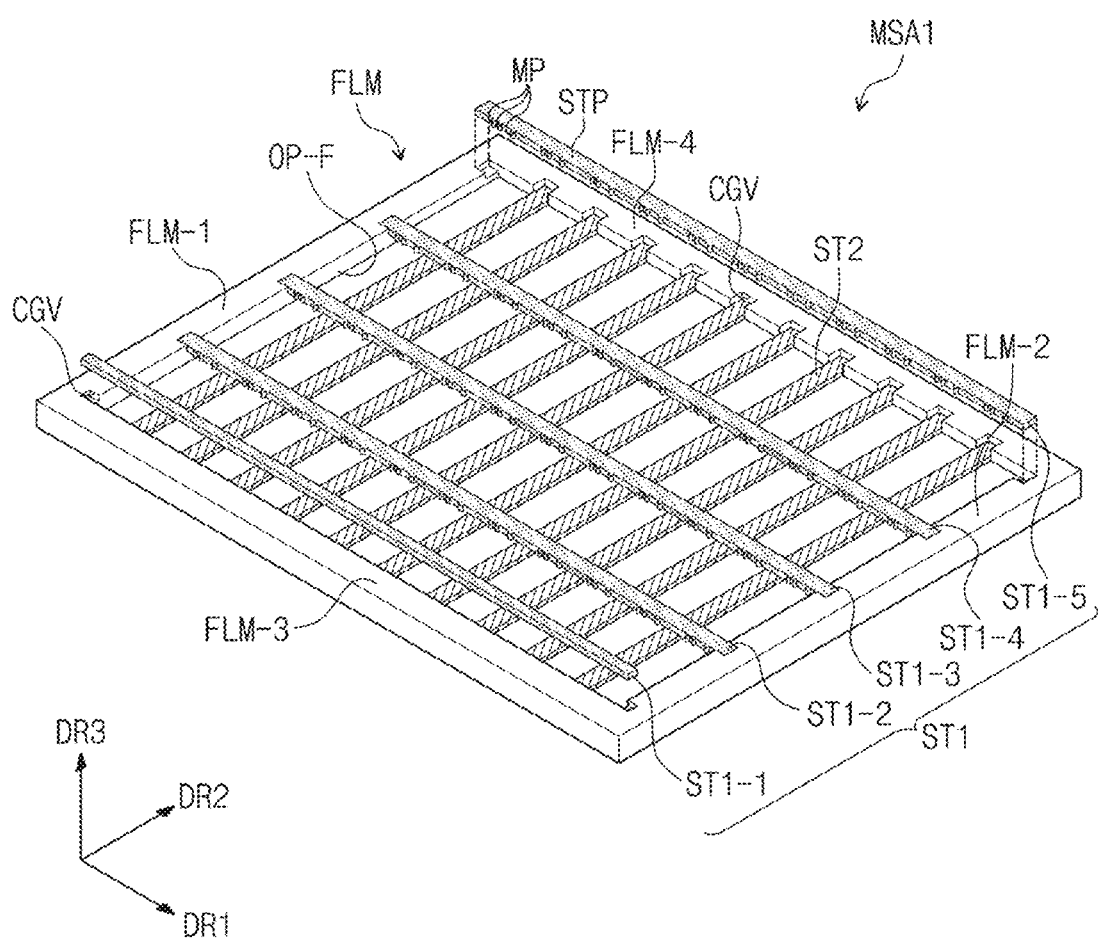
FIG. 8C is an exploded perspective view illustrating an exemplary embodiment of a first mask assembly according to the invention.
Figure 8D:
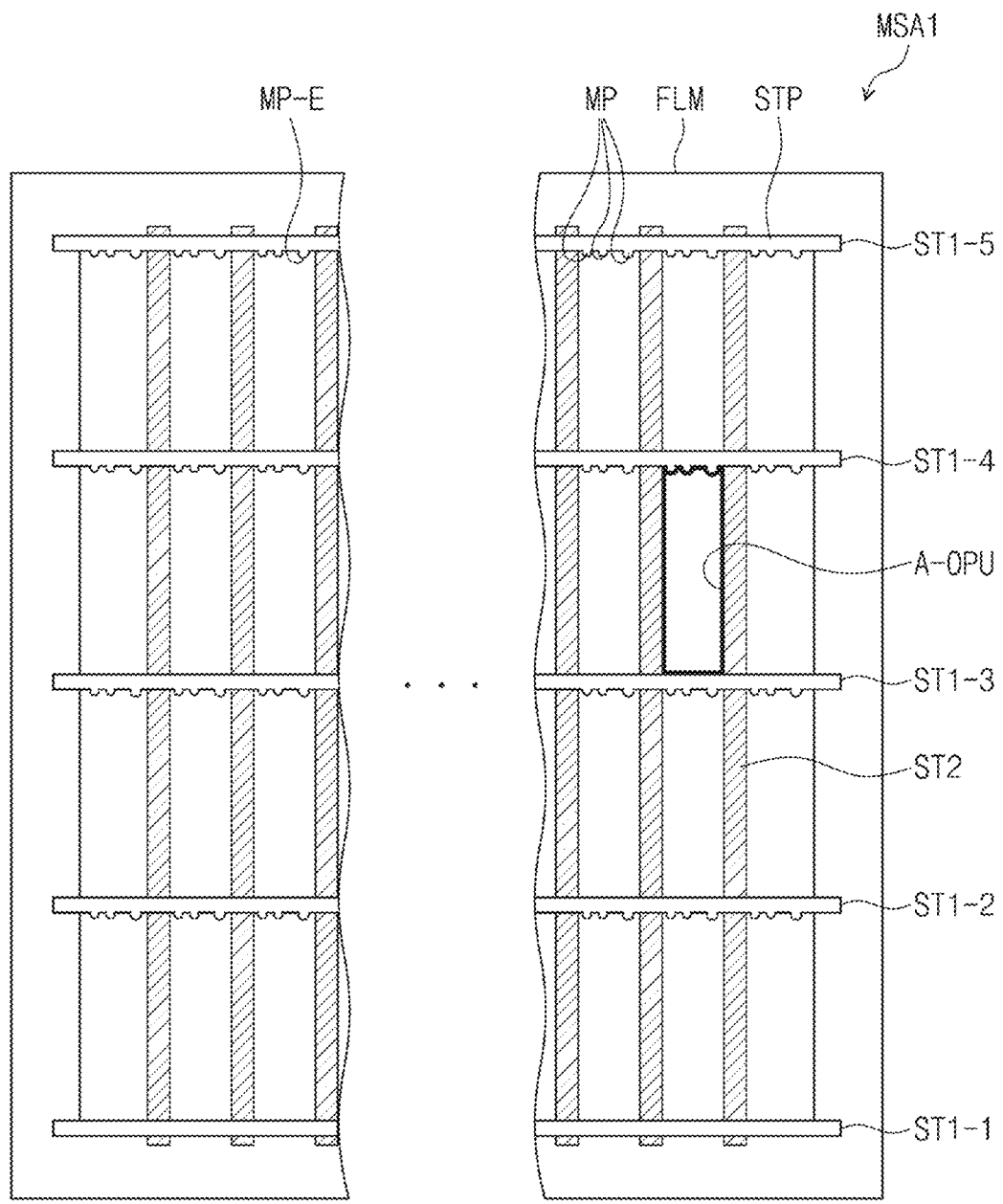
FIG. 8D is a plan view illustrating an exemplary embodiment of a first mask assembly according to the invention.
Figure 8E:
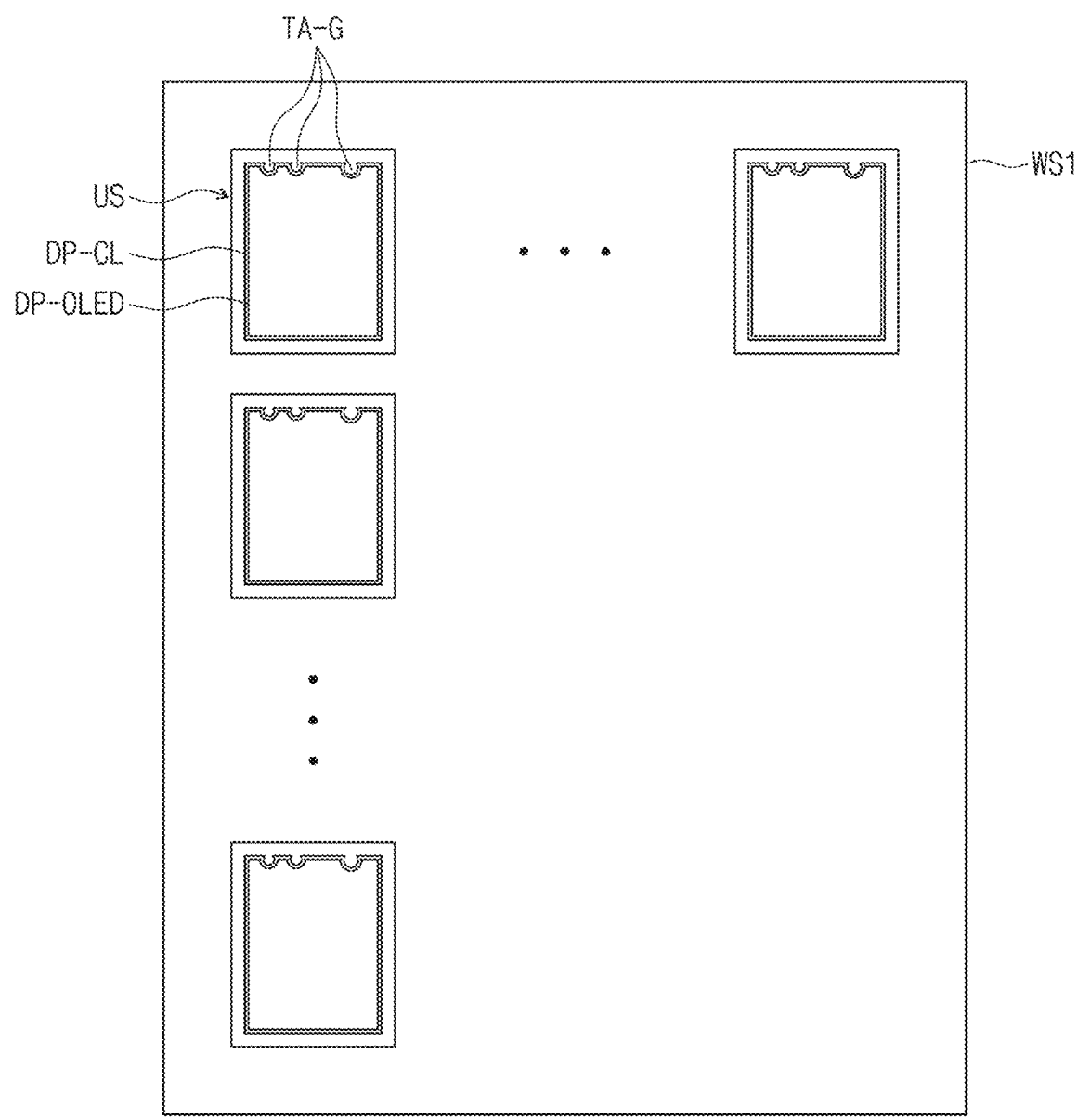
FIG. 8E is a plan view illustrating an exemplary embodiment of a work substrate according to the invention.
Figure 8F:
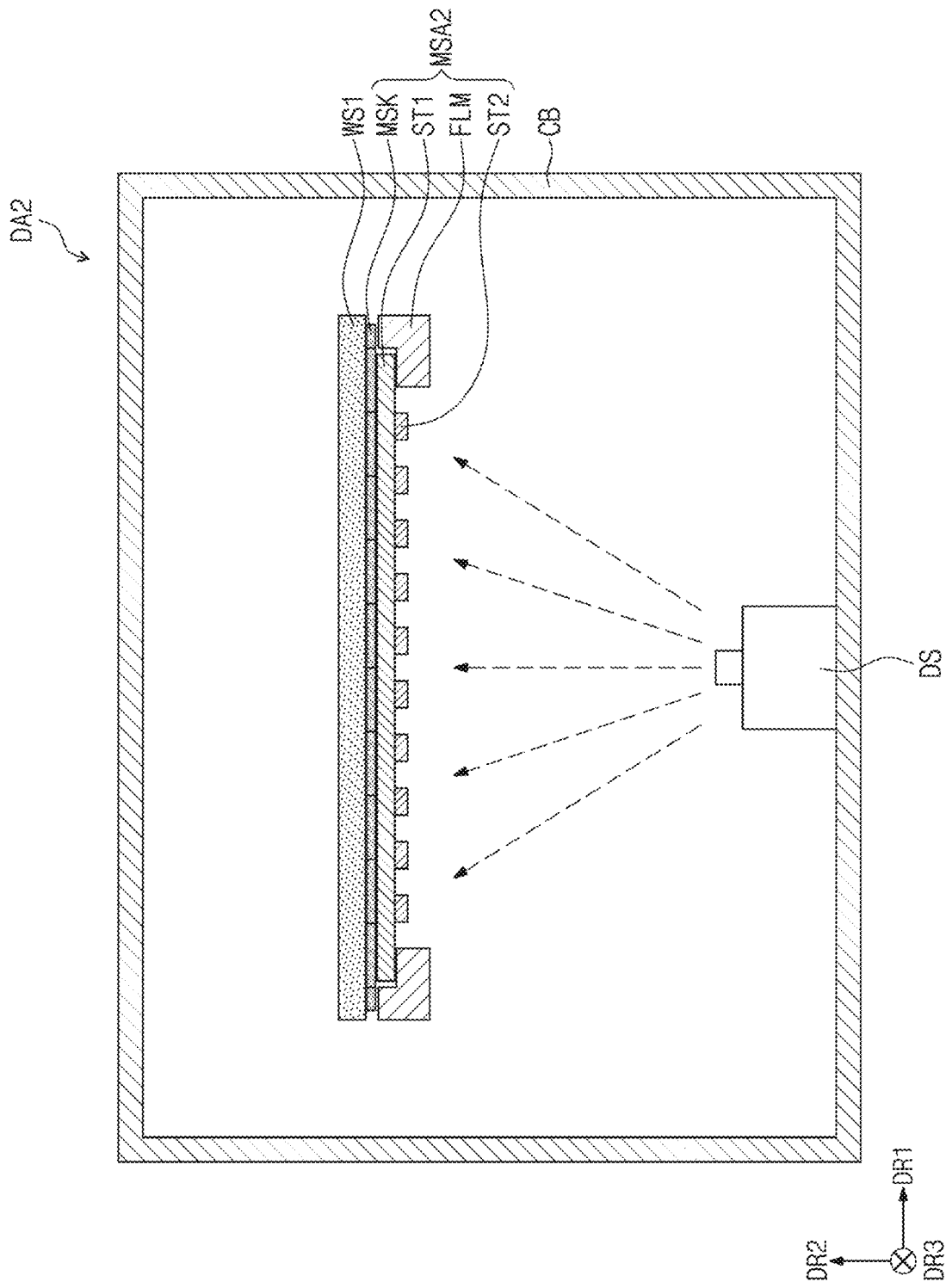
FIG. 8F is a cross-sectional view illustrating an exemplary embodiment of a second deposition equipment according to the invention.
Figure 8G:
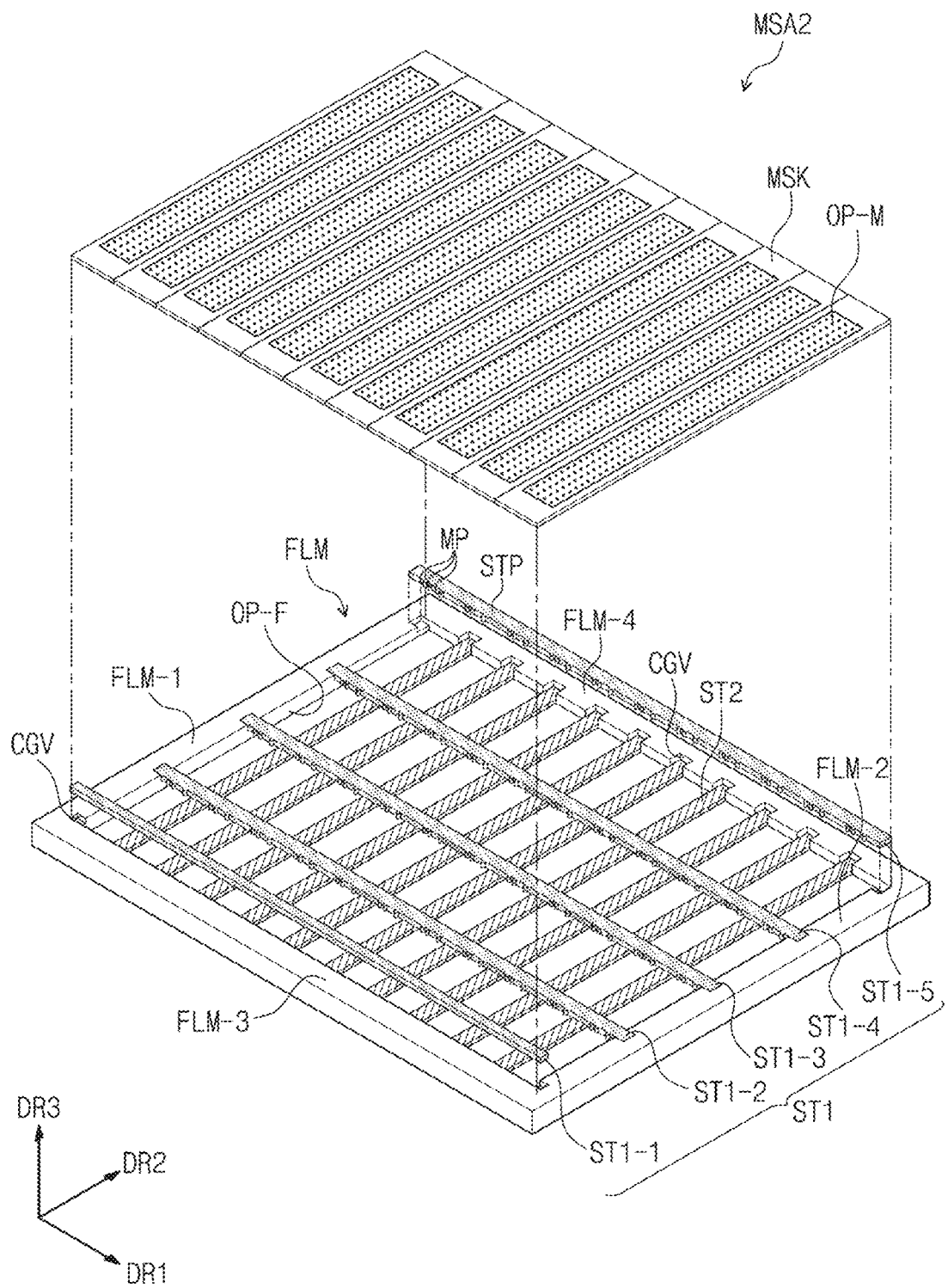
FIG. 8G is an exploded perspective view illustrating an exemplary embodiment of a second mask assembly according to the invention.
Figure 8H:
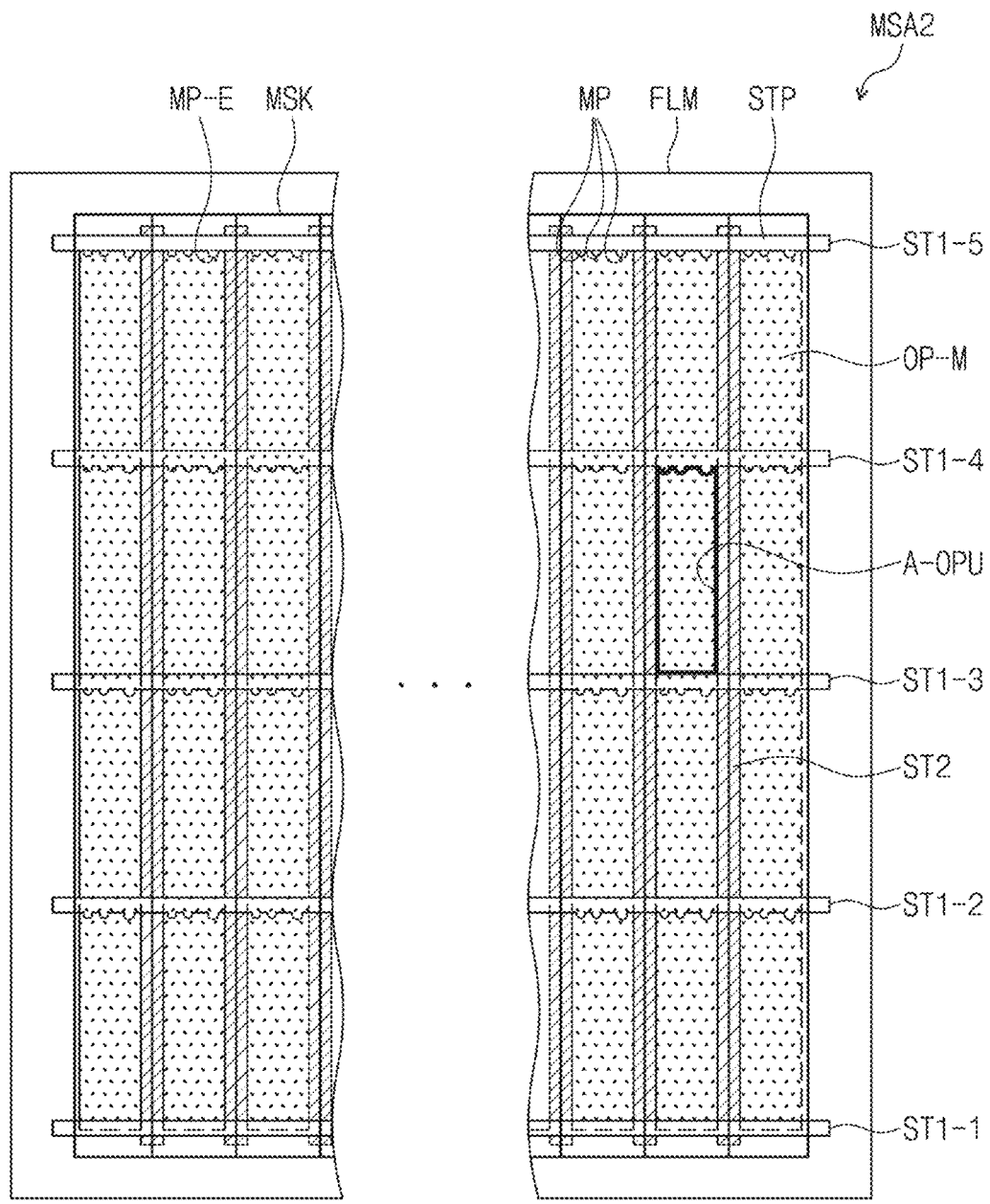
FIG. 8H is a plan view illustrating an exemplary embodiment of a second mask assembly according to the invention.
Figure 8I:
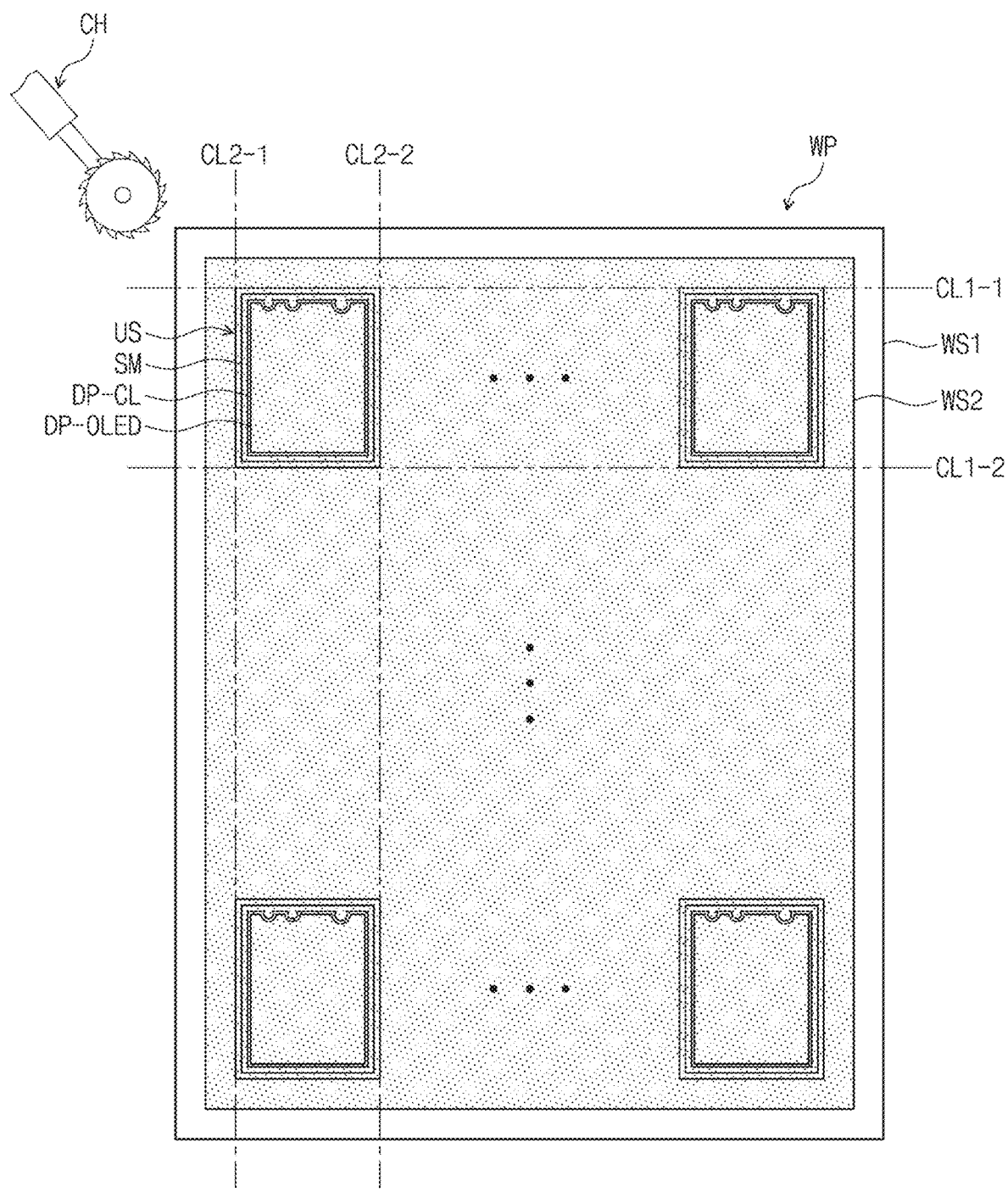
FIG. 8I is a plan view illustrating an exemplary embodiment of a work panel according to the invention.

FIG. 8A is a plan view illustrating an exemplary embodiment of a work substrate WS1 according to the invention. FIG. 8B is a cross-sectional view illustrating an exemplary embodiment of a first deposition equipment DA1 according to the invention. FIG. 8C is an exploded perspective view illustrating an exemplary embodiment of a first mask assembly MSA1 according to the invention. FIG. 8D is a plan view illustrating an exemplary embodiment of the first mask assembly MSA1 according to the invention. FIG. 8E is a plan view illustrating an exemplary embodiment of the work substrate WS1 according to the invention. FIG. 8F is a cross-sectional view illustrating an exemplary embodiment of second deposition equipment DA2 according to the invention. FIG. 8G is an exploded perspective view illustrating an exemplary embodiment of a second mask assembly MSA2 according to the invention. FIG. 8H is a plan view illustrating an exemplary embodiment of the second mask assembly MSA2 according to the invention. FIG. 8I is a plan view illustrating an exemplary embodiment of a work panel WP according to the invention.

A first work substrate WS1 illustrated in FIG. 8A may include a plurality of unit cell areas US. Each of the unit cell areas US may correspond to the display panel DP (refer to FIG. 7A).

The first work substrate WS1 of FIG. 8A is in a state in which the circuit element layer DP-CL is provided in each of the unit cell areas US. The circuit element layer DP-CL may be provided through processes of forming an insulating layer, a semiconductor layer and a conductive layer by coating and/or deposition methods, and processes of patterning the insulating layer, the semiconductor layer and the conductive layer by photolithography processes and/or etching processes, for example.

As illustrated in FIG. 8A, three non-deposition areas TA-G are defined in each of the unit cell areas US. However, the invention is not limited thereto, and in another exemplary embodiment, a different number of the non-deposition areas TA-G may be defined in each of the unit cell areas US. These unit cell areas US may be provided by the first deposition equipment DA1 illustrated in FIGS. 8B to 8D.

As illustrated in FIG. 8B, in an exemplary embodiment, the first deposition equipment DA1 according to the invention may include a deposition chamber CB, a deposition source DS disposed in the deposition chamber CB, and a first mask assembly MSA1 disposed in the deposition chamber CB. The first mask assembly MSA1 may support the first work substrate WS1. A bottom surface of the deposition chamber CB may be parallel to a plane defined by a first directional axis DR1 and a second directional axis DR2. A normal direction of the bottom surface of the deposition chamber CB may be indicated by a third directional axis DR3.

The deposition chamber CB may set a deposition condition to a vacuum. The deposition source DS may vaporize a deposition material (e.g., an inorganic material) and thus may provide deposition vapor.

Even though not shown in FIG. 8B, in an exemplary embodiment, the first deposition equipment DA1 may further include a jig or robot arm holding the first mask assembly MSA1, for example. In addition, the first deposition equipment DA1 may further include a mechanical apparatus for realizing an in-line system, for example.

FIG. 8A illustrates an atypical circuit element layer DP-CL including the three non-deposition areas TA-G, not a rectangular circuit element layer, when viewed in a plan view. This circuit element layer DP-CL may be provided using a unit cell opening area A-OPU illustrated in FIGS. 8C and 8D.

As illustrated in FIGS. 8C and 8D, the first mask assembly MSA1 may include a frame FLM, a plurality of first sticks ST1, and a plurality of second sticks ST2.

An opening OP-F may be defined in the frame FLM. The frame FLM may have a rectangular shape when viewed in a plan view. The frame FLM may include a metal material. In an exemplary embodiment, the frame FLM may include invar having a low coefficient of thermal expansion, for example. In an exemplary embodiment, the frame FLM may include, for example, nickel (Ni), a nickel-cobalt alloy, or a nickel-iron alloy.

The frame FLM may include four extensions FLM-1 to FLM-4. A plurality of coupling recesses may be defined in the frame FLM. In an exemplary embodiment, coupling recesses CGV into which the first sticks ST1 are coupled may be defined in each of first and second extensions FLM-1 and FLM-4, for example.

Each of the first sticks ST1 may include a stick portion STP and a mask portion MP. The stick portion STP may have a straight line shape which has a substantially constant width in the second direction DR2 and extends in the first direction DR1. The mask portion MP may be disposed to correspond to each of the unit cell opening areas A-OPU. The mask portion MP may cover the non-deposition area TA-G. The mask portion MP may protrude from the stick portion STP. The mask portion MP may have a curved edge MP-E. The shape of the mask portion MP may be a circle shape or may be a shape of one of two pieces obtained by dividing a circle by a single straight line, when viewed in a plan view.

In an exemplary embodiment, the mask portion MP and the stick portion STP may constitute a single unitary body. However, the invention is not limited thereto, and in another exemplary embodiment, the mask portion MP may be coupled to the stick portion STP by, for example, a welding process.

The first sticks ST1 may be coupled to the coupling recesses CGV of the frame FLM by a welding process. In an exemplary embodiment, the first sticks ST1 may include stainless steel ("SUS") as its material, for example. In FIGS. 8C and 8D, five first sticks ST1-1 to ST1-5 are illustrated as an example. However, the invention is not limited thereto, and in another exemplary embodiment, a different number of first sticks may be coupled to the coupling recesses CGV of the frame FLM.

The second sticks ST2 may be coupled to the frame FLM to overlap the opening OP-F. The second sticks ST2 may extend in the second direction DR2 and may be arranged in the first direction DR1. Both end portions of each of the second sticks ST2 may be inserted in the coupling recesses CGV defined in third and fourth extensions FLM-3 and FLM-4, respectively. Each of the second sticks ST2 may have a straight line shape having a substantially constant width in the first direction DR1.

Insulating layers BFL, CL1, CL2 and CL3 (refer to FIG. 7B) may be provided in each of the unit cell areas US by the first deposition equipment DA1 illustrated in FIGS. 8B to 8D. A conductive layer or a semiconductor layer may be provided in each of the unit cell areas US by the first deposition equipment DA1, and then, the conductive layer or the semiconductor layer may be patterned. Thus, patterns of the circuit element layer DP-CL of FIG. 7B may be provided. The method of forming the conductive pattern and the semiconductor pattern is not limited to a specific method.

According to the illustrated exemplary embodiment, the non-deposition area TA-G may be provided or secured using the first sticks ST1. Thus, manufacturing processes of the display panel DP may be simplified and a failure rate of the display panel DP may be reduced, as compared with a case in which a pattern is removed after depositing a layer.

The first work substrate WS1 of FIG. 8E is in a state in which the display element layer DP-OLED is provided in each of the unit cell areas US. Except for the emission layer EML (refer to FIG. 5C), other layers of the display element layer DP-OLED may be provided using the first deposition equipment DA1 illustrated in FIGS. 8B to 8D.

The emission layer EML may be provided using a second deposition equipment DA2 illustrated in FIGS. 8F to 8H. The second deposition equipment DA2 may include a second mask assembly MSA2 different from the first mask assembly MSA1. The second mask assembly MSA2 may further include masks MSK as compared with the first mask assembly MSA1.

A plurality of openings OP-M may be defined in each of the masks MSK. The openings OP-M may be uniformly arranged. Different kinds of the emission layers EML may be provided using a plurality of kinds of the masks MSK of which patterns of the openings OP-M are different from each other.

After the display element layer DP-OLED is provided in each of the unit cell areas US like the first work substrate WS1 of FIG. 8E, the first work substrate WS1 may be coupled to a second work substrate WS2. The sealing member SM may be disposed in each of the unit cell areas US. Hereinafter, the first and second work substrates WS1 and WS2 coupled to each other are defined as a work panel WP.

As illustrated in FIG. 8I, the unit cell areas US of the work panel WP may be separated from each other. The work panel WP may be cut along a first cutting line CL1-1 and a second cutting line CL1-2 by a cutting wheel CH. The cut unit cell stick may be cut along a third cutting line CL2-1 and a fourth cutting line CL2-2.

Side surfaces of pieces (preliminary display panels) obtained by cutting the work panel WP may be polished or ground to manufacture the display panel DP described with reference to FIGS. 1 to 7B.

Figure 9A:
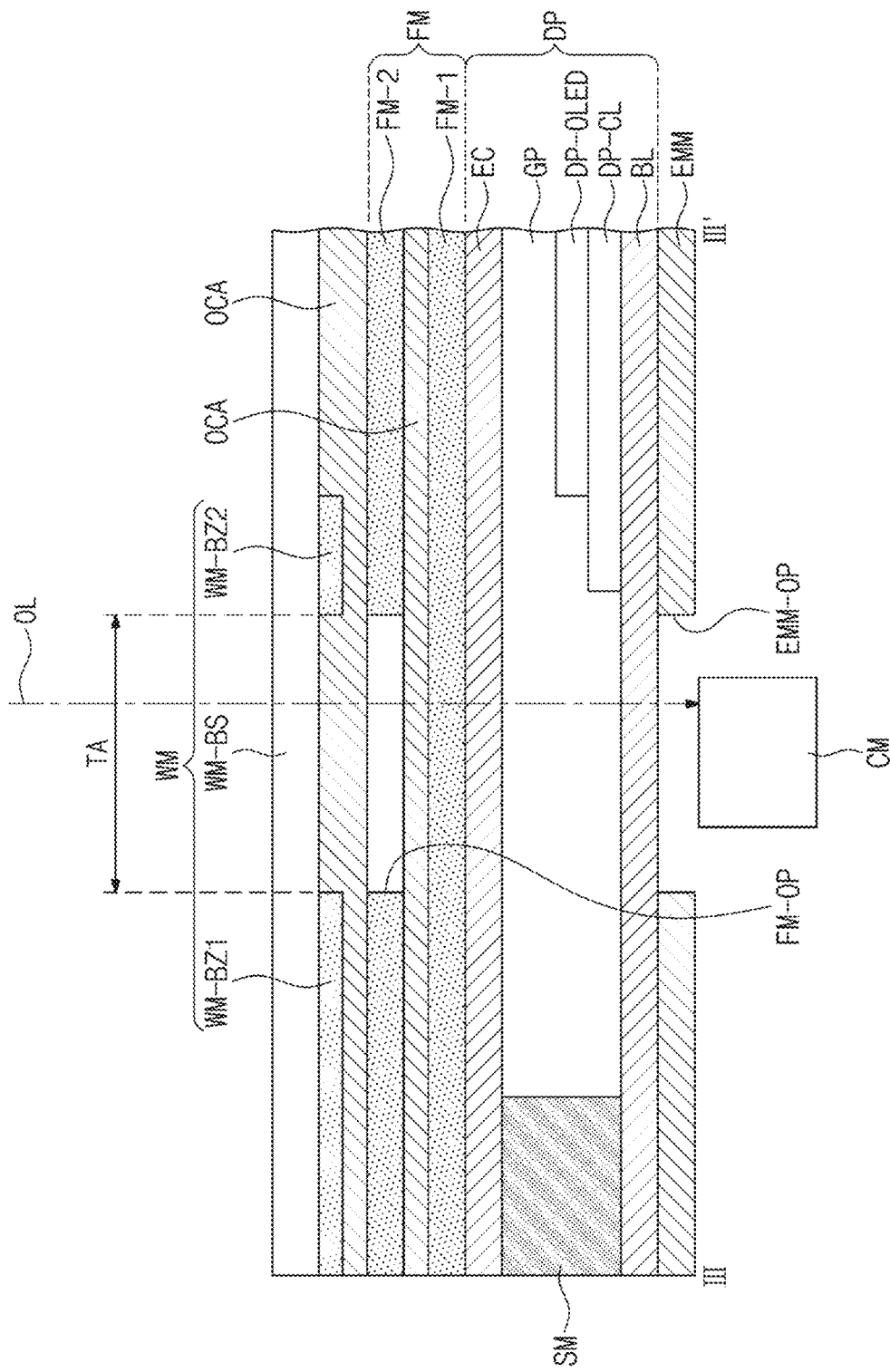
FIGS. 9A and 9B are cross-sectional views illustrating an exemplary embodiment of display modules according to the invention.
Figure 9B:
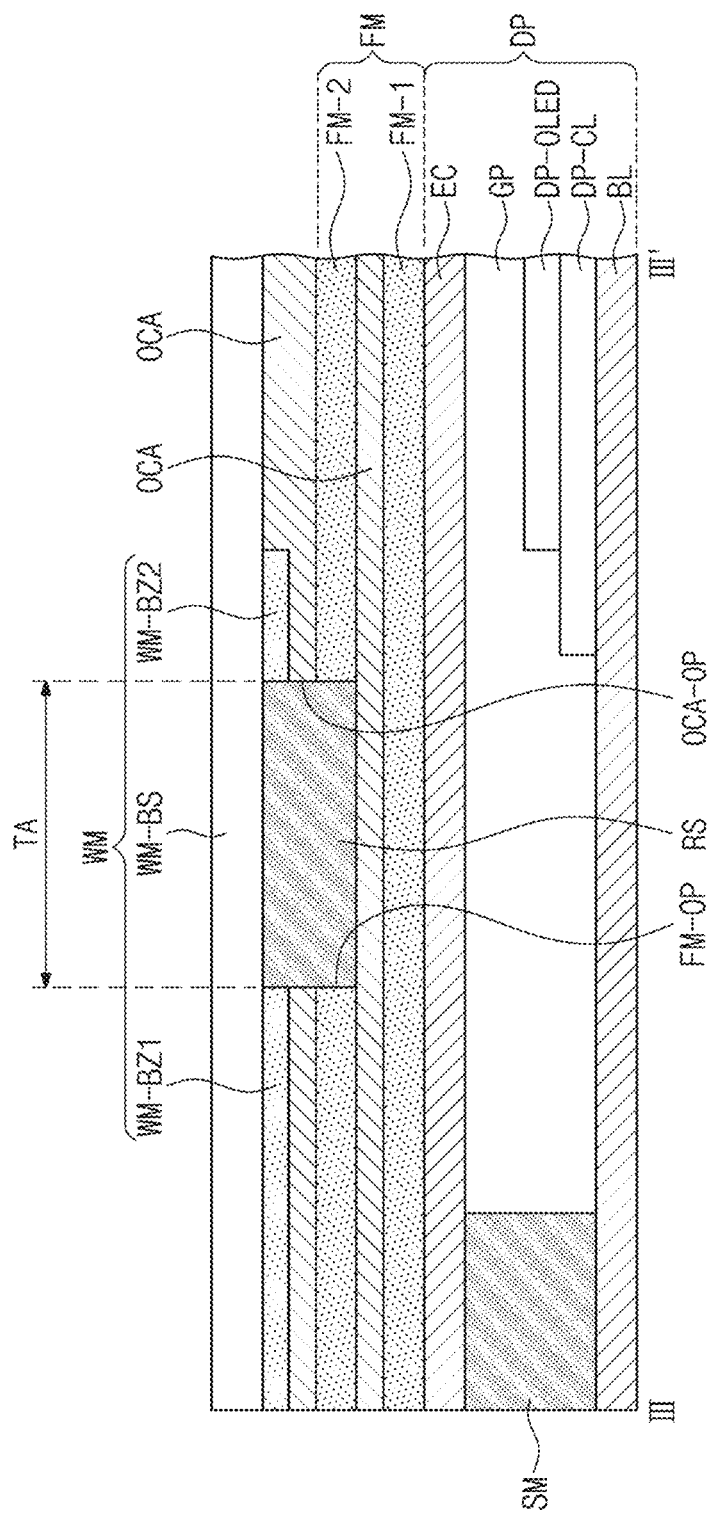

FIGS. 9A and 9B are cross-sectional views illustrating exemplary embodiments of display modules DM according to the invention. Hereinafter, the detailed descriptions to the same components as in FIGS. 1 to 8I will be omitted for the purpose of ease and convenience in description.

As illustrated in FIG. 9A, an elastic member EMM may further be disposed under the display panel DP. The elastic member EMM may protect the display panel DP from an external impact. The elastic member EMM may include a synthetic resin sheet with predetermined elasticity. In an exemplary embodiment, the elastic member EMM may include a urethane sheet, a porous sheet, or a sponge sheet, for example. An opening EMM-OP corresponding to the transmission area TA may be defined in the elastic member EMM.

Even though an opaque elastic member EMM is disposed under the display panel DP, the electronic optical module such as the camera module CM may receive or transmit an optical signal OL through the opening EMM-OP.

As illustrated in FIG. 9B, an opening OCA-OP may be defined in the adhesive member OCA coupling the window WM and the anti-reflector FM-2 to each other. A resin RS may fill the opening OCA-OP of the adhesive member OCA and the opening FM-OP of the anti-reflector FM-2. The resin RS may contact a bottom surface of the base substrate WM-BS. In an exemplary embodiment, the resin RS may have a light transmittance of about 90% or more, for example. The resin RS may improve durability of the display module DM.

In an exemplary embodiment, a refractive index of the resin RS may range from about 1.4 to about 1.6, for example. The refractive index of the resin RS may be substantially equal to a refractive index of the base substrate WM-BS. In an exemplary embodiment, the refractive index of the resin RS may have a tolerance of about 5% of the refractive index of the base substrate WM-BS, for example. Optically, the resin RS may be treated as a portion of the base substrate WM-BS, and thus a transmittance of the optical signal OL (refer to FIG. 9A) may be improved.

FIGS. 10A to 10G are partial plan views illustrating exemplary embodiments of display modules DM according to the invention. FIGS. 10A to 10G illustrate plan views corresponding to FIG. 6A. However, a display module DM having one transmission area TA is illustrated in each of FIGS. 10A to 10G. Hereinafter, the detailed descriptions to the same components as in FIGS. 1 to 9B will be omitted for the purpose of ease and convenience in description.

Figure 10A:
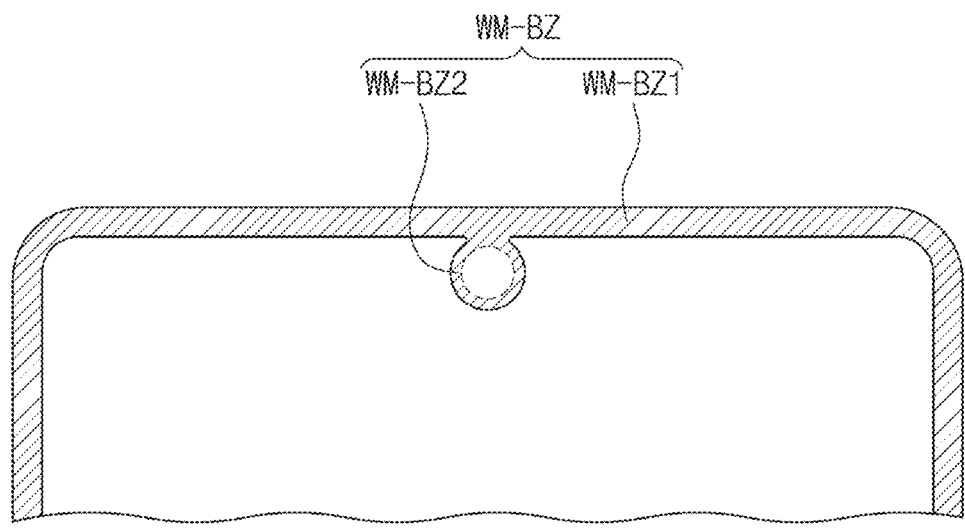
FIGS. 10A to 10G are partial plan views illustrating an exemplary embodiment of display modules according to the invention.
Figure 10B:
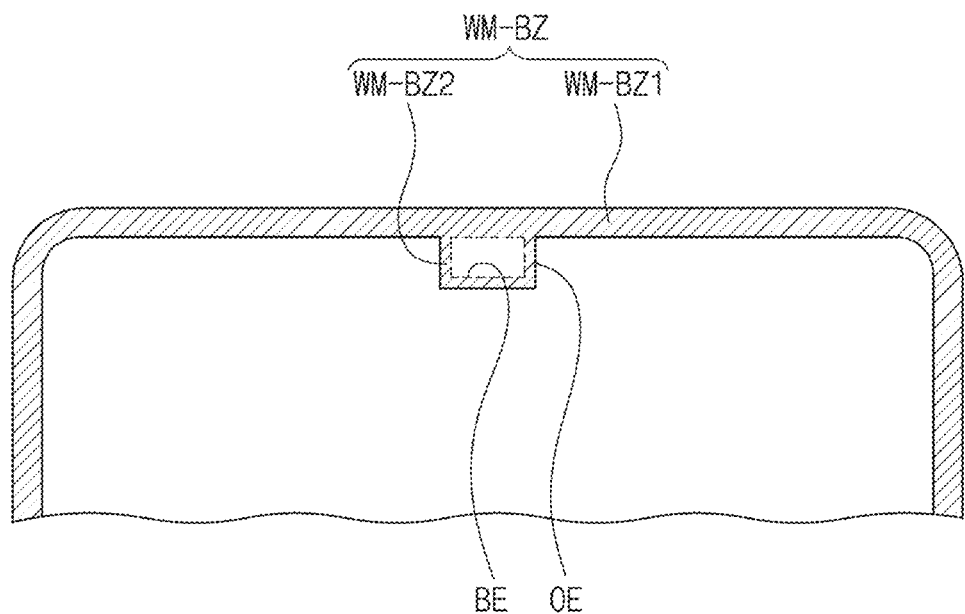

FIG. 10A illustrates an exemplary embodiment in which the transmission area TA disposed on a right side in FIG. 6A is shifted to a center. As illustrated in FIG. 10B, in an exemplary embodiment, an inner line BE and an outer line OE of the second bezel pattern WM-BZ2 may define substantially rectangular shapes.

Figure 10C:
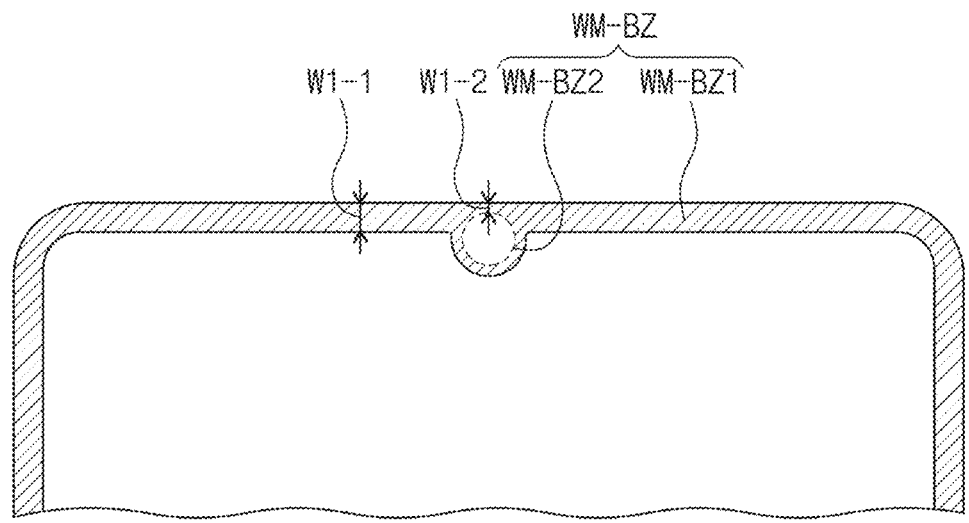
Figure 10D:
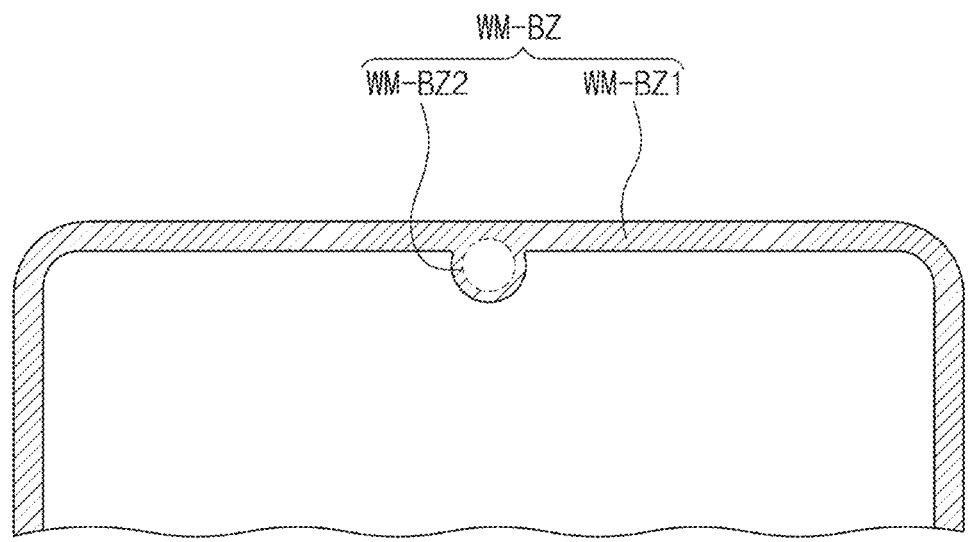
Figure 10E:
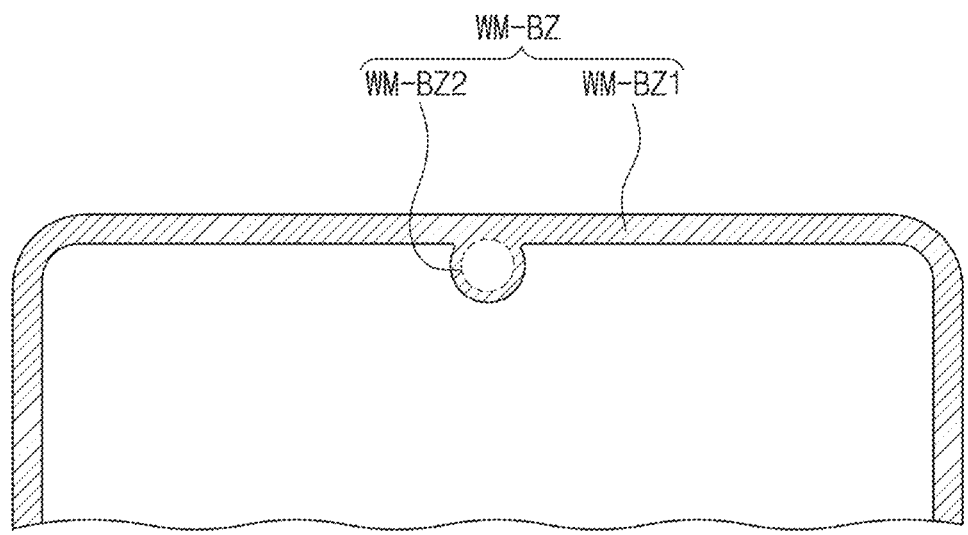

As illustrated in FIGS. 10C to 10E, a portion of the first bezel pattern WM-BZ1 may define the transmission area TA, together with the second bezel pattern WM-BZ2. A width W1-2 of the portion of the first bezel pattern WM-BZ1 may be less than a width W1-1 of another portion of the first bezel pattern WM-BZ1.

Figure 10F:
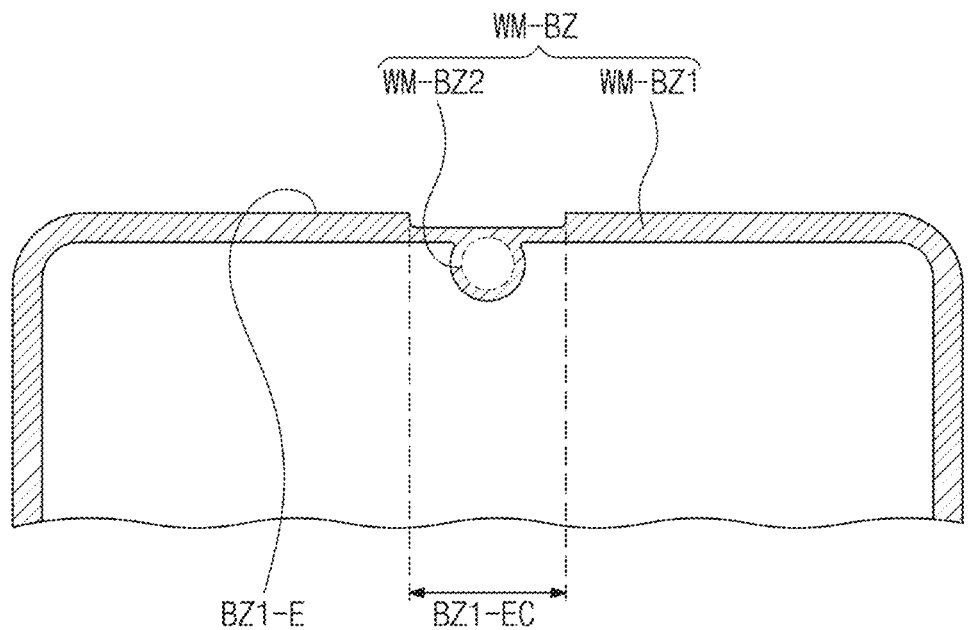

As illustrated in FIG. 10F, an outer edge BZ1-E of the first bezel pattern WM-BZ1 may include a region BZ1-EC which is concave toward the second bezel pattern WM-BZ2 when viewed in a plan view. A concave region may also be defined in the base substrate WM-BS (refer to FIG. 6C) to correspond to the concave region BZ1-EC.

Figure 10G:
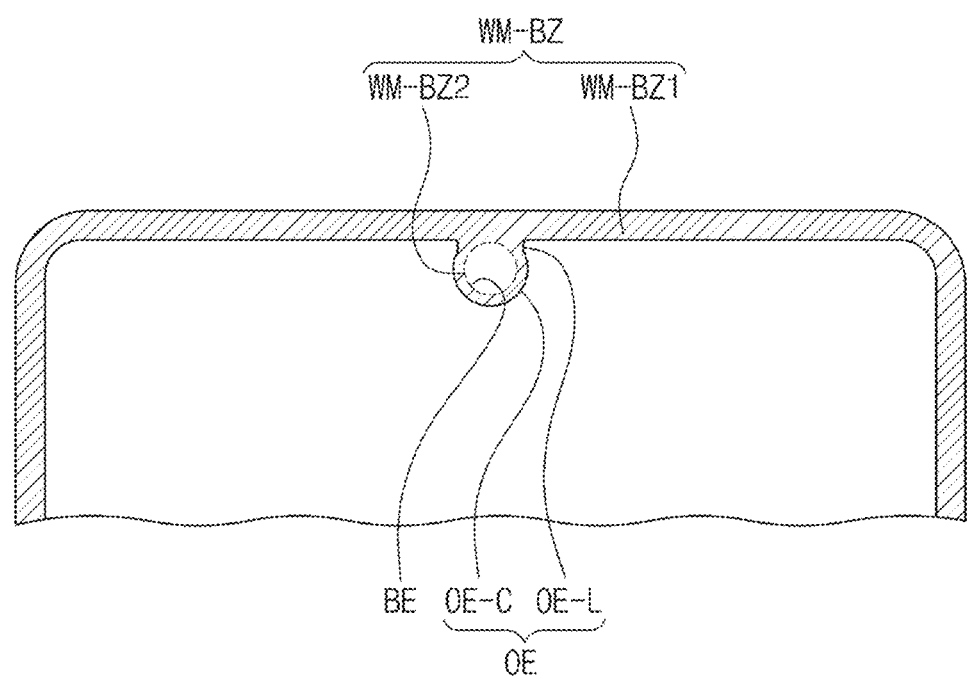

As illustrated in FIG. 10G, an outer edge OE of the second bezel pattern WM-BZ2 may include a curved portion OE-C and a straight portion OE-L when viewed in a plan view. The straight portion OE-L may be disposed in an area connecting the first bezel pattern WM-BZ1 and the curved portion OE-C.

According to the above descriptions, a wide display area and a narrow non-display area may be provided. In particular, the width of the second bezel pattern protruding toward a center of the display area in a plan view may be reduced.

Since an opening penetrating the display panel corresponding to the transmission area is not defined, failures or defects of the display panel may be reduced. The display module having high impact resistance may be provided.

In the display panel corresponding to the transmission area, an upper insulating layer may seal or encapsulate a lower insulating layer, and thus the circuit element and/or the light emitting element may be protected from moisture.

The display panel including the display area having an atypical shape may be manufactured by modifying the shape of the mask. Thus, manufacturing costs of the display panel may not be increased. Further, the display panel may have a regular shape, and thus the process of cutting the work panel may be simplified in the manufacturing method.

While the invention has been described with reference to exemplary embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A method for manufacturing a display panel, the method comprising:
    forming a circuit element layer including a transistor in each of a plurality of unit cell areas of a first work substrate;
    forming a display element layer including a light emitting element in each of the plurality of unit cell areas;
    coupling a second work substrate to the first work substrate to form a work panel; and
    cutting the work panel to separate portions corresponding to the plurality of unit cell areas from each other,
    wherein the forming the circuit element layer comprises depositing an insulating layer in each of the plurality of unit cell areas,
    the insulating layer has an outer edge,
    the outer edge includes a concave region which is concave toward a center of the insulating layer in a plan view, and
    a portion of a top surface of the first work substrate which corresponds to the concave region is exposed from the insulating layer.

2. The method of claim 1, wherein the depositing the insulating layer is performed using a first mask assembly, wherein the first mask assembly comprises:
    a frame in which an opening is defined;
    a plurality of first sticks coupled to the frame to overlap the opening, wherein the plurality of first sticks extends in a first direction and is arranged in a second direction intersecting the first direction; and
    a plurality of second sticks disposed to intersect the plurality of first sticks,
    wherein each of the plurality of first sticks comprises: a stick portion having a straight line shape; and a mask portion coupled to the stick portion and protruding outside the stick portion in the plan view.

3. The method of claim 2, wherein an edge of the mask portion includes a curved line in the plan view.

4. The method of claim 3, wherein the mask portion is provided in plural.

5. The method of claim 2, wherein the circuit element layer comprises a circuit area and a boundary area, and wherein the boundary area has a thickness less than a thickness of the circuit area.

6. The method of claim 1, wherein the forming the display element layer comprises depositing a plurality of light emitting patterns in each of the plurality of unit cell areas.

7. The method of claim 1, wherein the depositing the plurality of light emitting patterns is performed using a second mask assembly,
wherein the second mask assembly comprises:
a frame in which an opening is defined;
a plurality of first sticks coupled to the frame to overlap the opening, wherein the plurality of first sticks extends in a first direction and is arranged in a second direction intersecting the first direction;
a plurality of second sticks disposed to intersect the plurality of first sticks; and
a plurality of masks overlapping the plurality of first sticks,
wherein each of the plurality of first sticks comprises: a stick portion having a straight line shape; and a mask portion coupled to the stick portion and protruding outside the stick portion in the plan view, and
wherein each of the plurality of masks has a plurality of mask openings.

* * * * *